US012652781B2

(12) United States Patent
Gertiser et al.

(10) Patent No.: US 12,652,781 B2
(45) Date of Patent: *Jun. 9, 2026

(54) SYSTEMS AND METHODS FOR POWER MODULE FOR INVERTER FOR ELECTRIC VEHICLE

(71) Applicant: BorgWarner US Technologies LLC, Wilmington, DE (US)

(72) Inventors: Kevin M. Gertiser, Carmel, IN (US); Chris Fruth, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 450 days.

This patent is subject to a terminal disclaimer.

(21) Appl. No.: 18/344,422

(22) Filed: Jun. 29, 2023

(65) Prior Publication Data

US 2024/0105684 A1 Mar. 28, 2024

Related U.S. Application Data

(60) Provisional application No. 63/378,601, filed on Oct. 6, 2022, provisional application No. 63/377,501, filed (Continued)

(51) Int. Cl.
*H02M 1/32* (2007.01)
*H02M 1/00* (2007.01)
(Continued)

(52) U.S. Cl.
CPC ......... *H02M 1/327* (2021.05); *H02M 1/0054* (2021.05); *H02P 27/08* (2013.01);
(Continued)

(58) Field of Classification Search
CPC .. H02M 1/327; H02M 1/0054; H02M 1/0009; H02M 1/08; H02M 1/084;
(Continued)

(56) References Cited

U.S. PATENT DOCUMENTS

| | | | |
|---|---|---|---|
| 4,054,828 A | 10/1977 | Conzelmann et al. | |
| 4,128,801 A | 12/1978 | Gansert et al. | |

(Continued)

FOREIGN PATENT DOCUMENTS

| | | | |
|---|---|---|---|
| DE | 102013213448 A1 | 1/2015 | |
| EP | 3690938 A1 | 8/2020 | |

(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&a,p;ref_url=https%253A%252F%252Fwww.google.com%252F.

(Continued)

*Primary Examiner* — Britt Hanley
*Assistant Examiner* — Kieran M. Cunningham
(74) *Attorney, Agent, or Firm* — Joshua M. Haines; Bookoff McAndrews, PLLC

(57) ABSTRACT

A system includes: an inverter configured to convert DC power to AC power, wherein the inverter includes: a power module including: a flex layer including a gate trace providing an electrical connection to a gate input connection of the power module, a first substrate, a second substrate including a source plane, the source plane including a step trench, a semiconductor die disposed between the first substrate and the second substrate, the step trench formed in a portion of the source plane corresponding to at an edge of the semiconductor die, and the semiconductor die including a gate connected to the gate trace, and a sinter element disposed between the semiconductor die and the second substrate to connect the semiconductor die to the second substrate; a battery configured to supply the DC power to the (Continued)

inverter; and a motor configured to receive the AC power from the inverter.

17 Claims, 12 Drawing Sheets

Related U.S. Application Data on Sep. 28, 2022, provisional application No. 63/377,512, filed on Sep. 28, 2022, provisional application No. 63/377,486, filed on Sep. 28, 2022.

(51) Int. Cl.

| | |
|---|---|
| *H02P 27/08* | (2006.01) |
| *H05K 7/20* | (2006.01) |
| *H10W 40/00* | (2026.01) |
| *H10W 40/22* | (2026.01) |
| *H10W 40/25* | (2026.01) |
| *H10W 40/43* | (2026.01) |
| *H10W 40/60* | (2026.01) |
| *H10W 40/77* | (2026.01) |
| *H10W 70/40* | (2026.01) |
| *H10W 70/60* | (2026.01) |
| *H10W 70/65* | (2026.01) |
| *H10W 72/00* | (2026.01) |
| *H10W 90/00* | (2026.01) |
| *B60L 3/00* | (2019.01) |
| *B60L 15/00* | (2006.01) |
| *B60L 15/08* | (2006.01) |
| *B60L 15/20* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H02J 7/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 29/024* | (2016.01) |
| *H02P 29/68* | (2016.01) |
| *H03K 19/20* | (2006.01) |
| *H05K 1/14* | (2006.01) |
| *H05K 1/181* | (2026.01) |
| *H05K 1/182* | (2026.01) |
| *H05K 5/02* | (2006.01) |
| *H10D 64/01* | (2025.01) |
| *H10W 40/20* | (2026.01) |
| *H10W 40/47* | (2026.01) |
| *H10W 70/685* | (2026.01) |
| *H10W 70/692* | (2026.01) |
| *H10W 72/30* | (2026.01) |

(52) U.S. Cl.
CPC ..... *H05K 7/20154* (2013.01); *H05K 7/20254* (2013.01); *H05K 7/2049* (2013.01); *H05K 7/20854* (2013.01); *H05K 7/209* (2013.01); *H05K 7/20927* (2013.01); *H10W 40/037* (2026.01); *H10W 40/22* (2026.01); *H10W 40/255* (2026.01); *H10W 40/43* (2026.01); *H10W 40/611* (2026.01); *H10W 40/641* (2026.01); *H10W 40/778* (2026.01); *H10W 70/481* (2026.01); *H10W 70/611* (2026.01); *H10W 70/65* (2026.01); *H10W 90/00* (2026.01); *B60L 3/003* (2013.01); *B60L 15/007* (2013.01); *B60L 15/08* (2013.01); *B60L 15/20* (2013.01); *B60L 50/40* (2019.02); *B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60L 2210/30* (2013.01); *B60L 2210/40* (2013.01); *B60L 2210/42* (2013.01); *B60L 2210/44* (2013.01); *B60L 2240/36* (2013.01); *B60R 16/02* (2013.01); *G01R 15/20* (2013.01); *G06F 1/08* (2013.01); *G06F 13/4004* (2013.01); *G06F 2213/40* (2013.01); *H02J 7/855* (2026.01); *H02J 2207/20* (2020.01); *H02M 1/0009* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/085* (2013.01); *H02P 29/024* (2013.01); *H02P 29/027* (2013.01); *H02P 29/68* (2016.02); *H02P 2207/05* (2013.01); *H03K 19/20* (2013.01); *H05K 1/145* (2013.01); *H05K 1/181* (2013.01); *H05K 1/182* (2013.01); *H05K 5/0247* (2013.01); *H05K 7/2039* (2013.01); *H05K 2201/042* (2013.01); *H05K 2201/10166* (2013.01); *H10D 64/018* (2025.01); *H10W 40/226* (2026.01); *H10W 40/235* (2026.01); *H10W 40/47* (2026.01); *H10W 40/60* (2026.01); *H10W 70/685* (2026.01); *H10W 70/692* (2026.01); *H10W 72/07331* (2026.01); *H10W 72/07354* (2026.01); *H10W 72/30* (2026.01); *H10W 72/347* (2026.01); *H10W 90/734* (2026.01); *H10W 90/736* (2026.01)

(58) Field of Classification Search
CPC ........ H02M 1/088; H02M 1/123; H02M 1/32; H02M 1/322; H02M 1/4258; H02M 1/44; H02M 3/33523; H02M 7/003; H02M 7/537; H02M 7/5387; H02M 7/53871; H02M 7/53875; H02M 7/5395; H02M 3/003; H02M 1/0048; H02M 1/36; H02M 1/38; H02M 7/48; H02M 7/539; H02P 27/08; H02P 27/06; H02P 27/085; H02P 29/024; H02P 29/027; H02P 29/68; H02P 2207/05; H02P 29/0241; H02P 29/0243; H02P 29/025; H02P 29/026; H05K 7/20154; H05K 7/20254; H05K 7/2049;

H05K 7/20854; H05K 7/209; H05K
7/20927; H05K 1/145; H05K 1/181;
H05K 1/182; H05K 5/0247; H05K
7/2039; H05K 2201/042; H05K
2201/10166; H05K 7/14329; H10W
40/037; H10W 40/22; H10W 40/255;
H10W 40/43; H10W 40/611; H10W
40/641; H10W 40/778; H10W 70/481;
H10W 70/611; H10W 70/65; H10W
90/00; H10W 40/226; H10W 40/235;
H10W 40/47; H10W 40/60; H10W
70/685; H10W 70/692; H10W 72/07331;
H10W 72/07354; H10W 72/30; H10W
72/347; H10W 90/734; H10W 90/736;
H10W 40/228; H10W 72/00; H10W
72/07231; H10W 76/138; H10W 44/501;
H10W 90/401; H10W 90/701; B60L
3/003; B60L 15/007; B60L 15/08; B60L
15/20; B60L 50/40; B60L 50/51; B60L
50/60; B60L 50/64; B60L 53/20; B60L
53/22; B60L 53/62; B60L 2210/30; B60L
2210/40; B60L 2210/42; B60L 2210/44;
B60L 2240/36; B60L 2240/525; B60L
2240/526; B60L 2240/527; B60L
2240/529; B60L 3/0084; B60R 16/02;
G01R 15/20; G01R 31/006; G01R
31/2621; G01R 31/27; G01R 31/42;
G01R 31/52; G06F 1/08; G06F 13/4004;
G06F 2213/40; H02J 7/855; H02J
2207/20; H03K 19/20; H03K 2017/0806;
H03K 2217/0063; H03K 2217/0072;
H03K 5/1252; H03K 17/08104; H03K
17/08116; H03K 17/08122; H03K
17/0822; H03K 17/12; H03K 17/122;
H03K 17/162; H03K 17/164; H03K
17/165; H03K 17/167; H03K 17/18;
H03K 17/284; H03K 17/689; H03K
17/722; H03K 17/723; H10D 64/018;
H03F 2200/168; H03F 1/26; H04L
25/0266; H04L 25/03834; H04L 25/4902

USPC ........................................................ 257/684

See application file for complete search history.

(56) References Cited

U.S. PATENT DOCUMENTS

| | | | |
|---|---|---|---|
| 4,564,771 A | 1/1986 | Flohrs | |
| 4,618,875 A | 10/1986 | Flohrs | |
| 4,716,304 A | 12/1987 | Fiebig et al. | |
| 5,068,703 A | 11/1991 | Conzelmann et al. | |
| 5,432,371 A | 7/1995 | Denner et al. | |
| 5,559,661 A | 9/1996 | Meinders | |
| 5,654,863 A | 8/1997 | Davies | |
| 5,764,007 A | 6/1998 | Jones | |
| 5,841,312 A | 11/1998 | Mindl et al. | |
| 6,028,470 A | 2/2000 | Michel et al. | |
| 6,163,138 A | 12/2000 | Kohl et al. | |
| 6,351,173 B1 | 2/2002 | Ovens et al. | |
| 6,426,857 B1 | 7/2002 | Doster et al. | |
| 6,597,556 B1 | 7/2003 | Michel et al. | |
| 6,812,553 B2 | 11/2004 | Gerbsch et al. | |
| 6,943,293 B1 | 9/2005 | Jeter et al. | |
| 7,095,098 B2 | 8/2006 | Gerbsch et al. | |
| 7,229,855 B2 | 6/2007 | Murphy | |
| 7,295,433 B2 | 11/2007 | Taylor et al. | |
| 7,459,954 B2 | 12/2008 | Kuehner et al. | |
| 7,538,425 B2 | 5/2009 | Myers et al. | |
| 7,551,439 B2 | 6/2009 | Peugh et al. | |
| 7,616,047 B2 | 11/2009 | Rees et al. | |
| 7,724,046 B2 | 5/2010 | Wendt et al. | |
| 7,750,720 B2 | 7/2010 | Dittrich | |
| 9,088,159 B2 | 7/2015 | Peuser | |
| 9,275,915 B2 | 3/2016 | Heinisch et al. | |
| 9,373,970 B2 | 6/2016 | Feuerstack et al. | |
| 9,407,251 B1 | 8/2016 | Passmore et al. | |
| 9,431,932 B2 | 8/2016 | Schmidt et al. | |
| 9,515,584 B2 | 12/2016 | Koller et al. | |
| 9,548,675 B2 | 1/2017 | Schoenknecht | |
| 9,806,607 B2 | 10/2017 | Ranmuthu et al. | |
| 9,843,320 B2 | 12/2017 | Richter et al. | |
| 9,871,444 B2 | 1/2018 | Ni et al. | |
| 9,882,490 B2 | 1/2018 | Veeramreddi et al. | |
| 10,111,285 B2 | 10/2018 | Shi et al. | |
| 10,116,300 B2 | 10/2018 | Blasco et al. | |
| 10,232,718 B2 | 3/2019 | Trunk et al. | |
| 10,270,354 B1 | 4/2019 | Lu et al. | |
| 10,291,225 B2 | 5/2019 | Li et al. | |
| 10,525,847 B2 | 1/2020 | Strobel et al. | |
| 10,797,579 B2 | 10/2020 | Hashim et al. | |
| 10,924,001 B2 | 2/2021 | Li et al. | |
| 11,082,052 B2 | 8/2021 | Jang et al. | |
| 11,108,389 B2 | 8/2021 | Li et al. | |
| 11,342,911 B2 | 5/2022 | Lee et al. | |
| 11,838,011 B2 | 12/2023 | Li et al. | |
| 11,843,320 B2 | 12/2023 | Sivakumar et al. | |
| 11,848,426 B2 | 12/2023 | Zhang et al. | |
| 11,851,038 B2 | 12/2023 | Solanki et al. | |
| 11,855,522 B2 | 12/2023 | Rudolph et al. | |
| 11,855,630 B2 | 12/2023 | Dake et al. | |
| 11,870,338 B1 | 1/2024 | Narayanasamy | |
| 11,872,997 B2 | 1/2024 | Hoos et al. | |
| 11,881,859 B2 | 1/2024 | Gupta et al. | |
| 11,888,391 B2 | 1/2024 | Balasubramanian et al. | |
| 11,888,393 B2 | 1/2024 | Venkateswaran et al. | |
| 11,901,803 B2 | 2/2024 | Ruck et al. | |
| 11,901,881 B1 | 2/2024 | Narayanasamy | |
| 11,909,319 B2 | 2/2024 | Esteghlal et al. | |
| 11,916,426 B2 | 2/2024 | Oner et al. | |
| 11,923,762 B2 | 3/2024 | Sethumadhavan et al. | |
| 11,923,764 B1 | 3/2024 | Zhang | |
| 11,923,799 B2 | 3/2024 | Ojha et al. | |
| 11,925,119 B2 | 3/2024 | Male et al. | |
| 11,927,624 B2 | 3/2024 | Patel et al. | |
| 11,938,838 B2 | 3/2024 | Simonis et al. | |
| 11,942,927 B2 | 3/2024 | Purcarea et al. | |
| 11,942,934 B2 | 3/2024 | Ritter | |
| 11,945,331 B2 | 4/2024 | Blemberg et al. | |
| 11,945,522 B2 | 4/2024 | Matsumura et al. | |
| 11,949,320 B2 | 4/2024 | Jaladanki et al. | |
| 11,949,333 B2 | 4/2024 | Pahkala et al. | |
| 11,955,896 B2 | 4/2024 | Liu et al. | |
| 11,955,953 B2 | 4/2024 | Sinn et al. | |
| 11,955,964 B2 | 4/2024 | Agarwal et al. | |
| 11,962,234 B2 | 4/2024 | Narayanasamy et al. | |
| 11,962,291 B2 | 4/2024 | Oberdieck et al. | |
| 11,964,587 B2 | 4/2024 | Yukawa | |
| 11,970,076 B2 | 4/2024 | Sarfert et al. | |
| 11,977,404 B2 | 5/2024 | Chandrasekaran | |
| 11,984,802 B2 | 5/2024 | Merkin et al. | |
| 11,984,876 B2 | 5/2024 | Neidorff et al. | |
| 11,990,776 B2 | 5/2024 | Dulle | |
| 11,990,777 B2 | 5/2024 | Woll et al. | |
| 11,996,686 B2 | 5/2024 | Chan et al. | |
| 11,996,699 B2 | 5/2024 | Vasconcelos Araujo et al. | |
| 11,996,714 B2 | 5/2024 | El Markhi et al. | |
| 11,996,715 B2 | 5/2024 | Nandi et al. | |
| 11,996,762 B2 | 5/2024 | Hembach et al. | |
| 11,996,830 B2 | 5/2024 | Murthy et al. | |
| 11,996,847 B1 | 5/2024 | Kazama et al. | |
| 12,003,191 B2 | 6/2024 | Chaudhary et al. | |
| 12,003,229 B2 | 6/2024 | Kaya et al. | |
| 12,003,237 B2 | 6/2024 | Waters | |
| 12,008,847 B2 | 6/2024 | Braun et al. | |
| 12,009,679 B2 | 6/2024 | Gottwald et al. | |
| 12,012,057 B2 | 6/2024 | Schneider et al. | |
| 12,015,342 B2 | 6/2024 | Kienzler et al. | |
| 12,019,112 B2 | 6/2024 | Jarmolowitz et al. | |
| 12,021,517 B2 | 6/2024 | S et al. | |

(56) References Cited

U.S. PATENT DOCUMENTS

| 12,457,721 | B2 * | 10/2025 | Gertiser | B60L 15/007 |
| 12,537,442 | B2 * | 1/2026 | Gertiser | B60L 15/007 |
| 2004/0169266 | A1 | 9/2004 | Maxwell | |
| 2008/0054439 | A1 * | 3/2008 | Malhan | H10W 70/658 |
| | | | | 257/E23.071 |
| 2014/0225274 | A1 * | 8/2014 | Guyenot | H10W 72/01 |
| | | | | 257/774 |
| 2015/0210157 | A1 | 7/2015 | Yokoyama et al. | |
| 2015/0246619 | A1 | 9/2015 | Nagao et al. | |
| 2017/0236782 | A1 | 8/2017 | Nonaka et al. | |
| 2017/0331469 | A1 | 11/2017 | Kilb et al. | |
| 2018/0167013 | A1 | 6/2018 | Xu et al. | |
| 2019/0296657 | A1 | 9/2019 | Chung et al. | |
| 2020/0099286 | A1 | 3/2020 | Maeda | |
| 2020/0169147 | A1 | 5/2020 | Söhnle | |
| 2020/0195121 | A1 | 6/2020 | Keskar et al. | |
| 2021/0005711 | A1 | 1/2021 | Martinez-Limia et al. | |
| 2021/0219415 | A1 | 7/2021 | Goergen et al. | |
| 2022/0052610 | A1 | 2/2022 | Plum | |
| 2022/0294441 | A1 | 9/2022 | Purcarea et al. | |
| 2023/0010616 | A1 | 1/2023 | Gschwantner et al. | |
| 2023/0061922 | A1 | 3/2023 | Ritter | |
| 2023/0082076 | A1 | 3/2023 | Strache et al. | |
| 2023/0126070 | A1 | 4/2023 | Oberdieck et al. | |
| 2023/0179198 | A1 | 6/2023 | Winkler | |
| 2023/0231210 | A1 | 7/2023 | Joos et al. | |
| 2023/0231400 | A1 | 7/2023 | Oberdieck et al. | |
| 2023/0231496 | A1 | 7/2023 | Syed et al. | |
| 2023/0238808 | A1 | 7/2023 | Swoboda et al. | |
| 2023/0268826 | A1 | 8/2023 | Yan et al. | |
| 2023/0335509 | A1 | 10/2023 | Poddar | |
| 2023/0365086 | A1 | 11/2023 | Schumacher et al. | |
| 2023/0370062 | A1 | 11/2023 | Wolf | |
| 2023/0378022 | A1 | 11/2023 | Kim et al. | |
| 2023/0386963 | A1 | 11/2023 | Kim et al. | |
| 2023/0402930 | A1 | 12/2023 | Corry et al. | |
| 2023/0420968 | A1 | 12/2023 | Oner et al. | |
| 2023/0421049 | A1 | 12/2023 | Neidorff | |
| 2024/0006869 | A1 | 1/2024 | Kim et al. | |
| 2024/0006899 | A1 | 1/2024 | Wernerus | |
| 2024/0006993 | A1 | 1/2024 | Barjati et al. | |
| 2024/0022187 | A1 | 1/2024 | Fassnacht | |
| 2024/0022240 | A1 | 1/2024 | Balaz | |
| 2024/0022244 | A1 | 1/2024 | S et al. | |
| 2024/0030730 | A1 | 1/2024 | Wernerus | |
| 2024/0039062 | A1 | 2/2024 | Wernerus | |
| 2024/0039402 | A1 | 2/2024 | Bafna et al. | |
| 2024/0039406 | A1 | 2/2024 | Chen et al. | |
| 2024/0048048 | A1 | 2/2024 | Zhang | |
| 2024/0055488 | A1 | 2/2024 | Lee et al. | |
| 2024/0067116 | A1 | 2/2024 | Qiu | |
| 2024/0072675 | A1 | 2/2024 | Formenti et al. | |
| 2024/0072817 | A1 | 2/2024 | K et al. | |
| 2024/0077899 | A1 | 3/2024 | Chitnis et al. | |
| 2024/0078204 | A1 | 3/2024 | Roehrle et al. | |
| 2024/0079950 | A1 | 3/2024 | Narayanasamy | |
| 2024/0079958 | A1 | 3/2024 | Kumar et al. | |
| 2024/0080028 | A1 | 3/2024 | Dake et al. | |
| 2024/0088647 | A1 | 3/2024 | Ramadass et al. | |
| 2024/0088896 | A1 | 3/2024 | Bilhan et al. | |
| 2024/0097437 | A1 | 3/2024 | Goyal et al. | |
| 2024/0097459 | A1 | 3/2024 | Swoboda et al. | |
| 2024/0100963 | A1 * | 3/2024 | Buehler | B60L 15/007 |
| 2024/0105276 | A1 | 3/2024 | Duryea | |
| 2024/0106248 | A1 | 3/2024 | Woll et al. | |
| 2024/0106435 | A1 | 3/2024 | Zhang et al. | |
| 2024/0107675 | A1 * | 3/2024 | Buehler | B60L 15/007 |
| 2024/0107699 | A1 | 3/2024 | Kim | |
| 2024/0113517 | A1 | 4/2024 | Sriraj et al. | |
| 2024/0113611 | A1 | 4/2024 | Kaufmann et al. | |
| 2024/0113620 | A1 | 4/2024 | Ranmuthu et al. | |
| 2024/0113624 | A1 | 4/2024 | Southard et al. | |
| 2024/0120558 | A1 | 4/2024 | Zhang et al. | |
| 2024/0120765 | A1 | 4/2024 | Oner et al. | |
| 2024/0120962 | A1 | 4/2024 | Miriyala et al. | |
| 2024/0128851 | A1 | 4/2024 | Ruck et al. | |
| 2024/0128859 | A1 | 4/2024 | Chen | |
| 2024/0128867 | A1 | 4/2024 | Wang et al. | |
| 2024/0146177 | A1 | 5/2024 | Mehdi et al. | |
| 2024/0146306 | A1 | 5/2024 | Ramkaj et al. | |
| 2024/0149734 | A1 | 5/2024 | Eisenlauer | |
| 2024/0162723 | A1 | 5/2024 | Zipf et al. | |
| 2024/0178756 | A1 | 5/2024 | El-Markhi et al. | |
| 2024/0178824 | A1 | 5/2024 | Kazama et al. | |
| 2024/0186803 | A1 | 6/2024 | Krieg et al. | |
| 2024/0198937 | A1 | 6/2024 | Benqassmi et al. | |
| 2024/0198938 | A1 | 6/2024 | Carlos et al. | |
| 2024/0204540 | A1 | 6/2024 | Majmunovic et al. | |
| 2024/0204541 | A1 | 6/2024 | Majmunovic et al. | |
| 2024/0204671 | A1 | 6/2024 | Liu et al. | |
| 2024/0204765 | A1 | 6/2024 | Dake | |
| 2024/0213874 | A1 | 6/2024 | Junnarkar et al. | |
| 2024/0213971 | A1 | 6/2024 | Lee | |
| 2024/0213975 | A1 | 6/2024 | Narayanasamy | |
| 2024/0213981 | A1 | 6/2024 | Agarwal et al. | |
| 2024/0244790 | A1 | 7/2024 | Kako | |

FOREIGN PATENT DOCUMENTS

| WO | 2007093598 | A1 | 8/2007 |
| WO | 2019034505 | A1 | 2/2019 |
| WO | 2020156820 | A1 | 8/2020 |
| WO | 2020239797 | A1 | 12/2020 |
| WO | 2021110405 | A1 | 6/2021 |
| WO | 2021167596 | A1 | 8/2021 |
| WO | 2021213728 | A1 | 10/2021 |
| WO | 2022012943 | A1 | 1/2022 |
| WO | 2022229149 | A1 | 11/2022 |
| WO | 2023006491 | A1 | 2/2023 |
| WO | 2023046607 | A1 | 3/2023 |
| WO | 2023094053 | A1 | 6/2023 |
| WO | 2023110991 | A1 | 6/2023 |
| WO | 2023147907 | A1 | 8/2023 |
| WO | 2023151850 | A1 | 8/2023 |
| WO | 2023227278 | A1 | 11/2023 |
| WO | 2023237248 | A1 | 12/2023 |
| WO | 2024006181 | A2 | 1/2024 |
| WO | 2024012743 | A1 | 1/2024 |
| WO | 2024012744 | A1 | 1/2024 |
| WO | 2024022219 | A1 | 2/2024 |
| WO | 2024041776 | A1 | 2/2024 |
| WO | 2024046614 | A1 | 3/2024 |
| WO | 2024049730 | A1 | 3/2024 |
| WO | 2024049884 | A1 | 3/2024 |
| WO | 2024049909 | A1 | 3/2024 |
| WO | 2024056388 | A1 | 3/2024 |
| WO | 2024068065 | A1 | 4/2024 |
| WO | 2024068076 | A1 | 4/2024 |
| WO | 2024068113 | A1 | 4/2024 |
| WO | 2024068115 | A1 | 4/2024 |
| WO | 2024083391 | A1 | 4/2024 |
| WO | 2024093384 | A1 | 5/2024 |
| WO | 2024104970 | A1 | 5/2024 |
| WO | 2024078401 | A1 | 5/2024 |
| WO | 2024110106 | A1 | 5/2024 |
| WO | 2024110265 | A1 | 5/2024 |
| WO | 2024110297 | A1 | 5/2024 |
| WO | 2024114978 | A1 | 6/2024 |
| WO | 2024114979 | A1 | 6/2024 |
| WO | 2024114980 | A1 | 6/2024 |
| WO | 2024128286 | A1 | 6/2024 |
| WO | 2024132249 | A1 | 6/2024 |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

(56) References Cited

OTHER PUBLICATIONS

Wang et al. "Status and Trend of Power Semiconductor Module Packaging for Electric Vehicles", InTech, published Oct. 5, 2016.

"DuPont Pyralux® AP to Aid Reliable Performance of Semikron-Danfoss eMPack® Modules Powering Next-Gen Electric Vehicles", dupont.com Ideas and Innovation Blog, <<https://www.dupont.com/blogs/dupont-pyralux-to-aid-reliable-next-gen-electric-vehicles.html>>, Sep. 22, 2022.

"E-Mobility and Utility Electric Vehicles" Semikron Danfoss brochure <<https://www.semikron-danfoss.com/dl/service-support/downloads/download/semikron-danfoss-brochure-power-electronics-for-emobility-utility-electric-vehicles.pdf>>, issued Mar. 31, 2022.

"Technical Explanation eMPack A4 Application Kit", Semikron, <<https://www.semikron-danfoss.com/dl/service-support/downloads/download/semikron-technical-explanation-empack-applicationkit-2021-02-05-rev-04.pdf>>, issued Feb. 5, 2021.

"SiC power modules for your electric vehicle design", STMicroelectronics <<https://www.st.com/content/dam/pcim-2020/presentations/stmicroelectronics-pcim2020-sic-power-modules-for-your-electric-vehicle-designs.pdf>>, retrieved Jan. 28, 2022.

"DuPont Pyralux LF Acrylic-Based Coverlay", pyralux.dupont.com, <<https://www.dupont.com/content/dam/dupont/amer/us/en/products/ei-transformation/documents/EI-10118-Pyralux-LF-CL-Data-Sheet.pdf>>, retrieved Oct. 26, 2021.

"DuPont Pyralux AP All-Polyimide Double-Sided Copper-Clad Laminate", pyralux.dupont.com, <<https://www.dupont.com/content/dam/dupont/amer/us/en/products/ei-transformation/documents/EI-10124-Pyralux-AP-Data-Sheet.pdf>>, retrieved Sep. 23, 2021.

"Flex and Material Sets with Chris Hunrath", podcast with Judy Warner, altium.com, <<https://resources.altium.com/p/flex-and-material-sets-with-chris-hunrath-podcast>>, retrieved Oct. 18, 2021.

"Kapton Polyimide Film and Pyralux Laminated Circuit Materials Provide Superior Performance in Satellite/Spacecraft Applications", dupont.com, <<https://www.dupont.com/content/dam/dupont/amer/us/en/products/ei-transformation/documents/EI00373_Space-Application-Flyer.pdf>>, Aug. 2021.

DeVoto, Douglas, "Advanced Power Electronics Designs—Reliability and Prognostics" National Renewable Energy Laboratory, nrel.gov, <<https://www.nrel.gov/docs/fy20osti/76667.pdf>>, Jun. 2, 2020.

Balogh, L., "Fundamentals of MOSFET and IGBT Gate Driver Circuits," Texas Instruments Application Report, SLUA618-Mar. 2017, Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

* cited by examiner

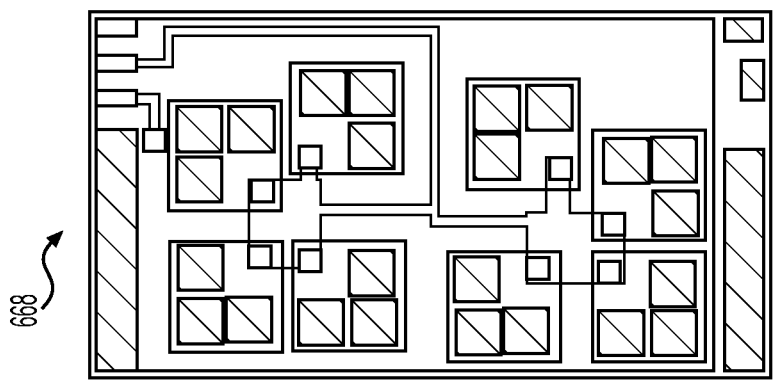
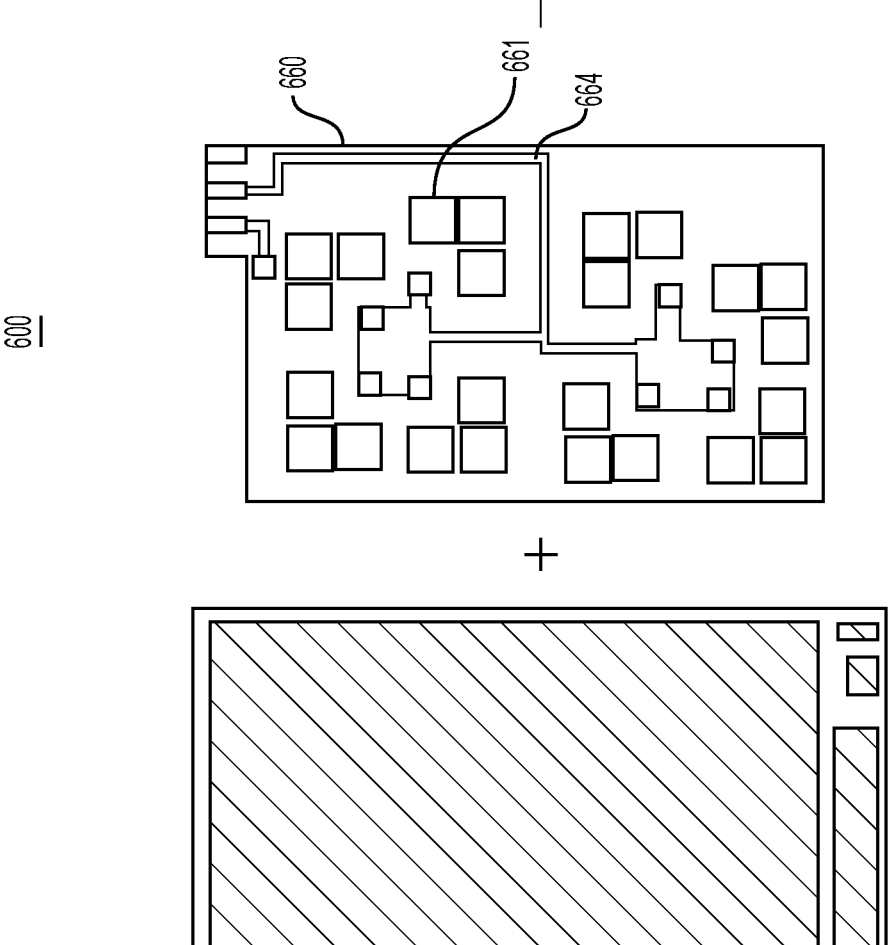
*FIG. 6*

1

SYSTEMS AND METHODS FOR POWER MODULE FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377, 501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to a power module for an inverter for an electric vehicle, and more specifically, to a power module including a trench that enables flexible sinter element sizing.

BACKGROUND

Inverters, such as those used to drive a motor in an electric vehicle, for example, are responsible for converting High Voltage Direct Current (HVDC) into Alternating Current (AC) to drive the motor. In an inverter, a power module may include devices that generate a large amount of heat. The layout and design of the power module affects the operation of the devices and the thermal characteristics of the power module. Incorrect operation of the devices or overheating of the power module may compromise the operation of the inverter. In addition, some components or materials employed in power module designs may negate advantages that come with the use of such components or materials, and restrict design flexibility as a result.

The present disclosure is directed to overcoming one or more of these above-referenced challenges.

SUMMARY OF THE DISCLOSURE

In some aspects, the techniques described herein relate to a system including: an inverter configured to convert DC power to AC power, wherein the inverter includes: a power module including: a first substrate, a second substrate including a source plane and a gate plane separated from the source plane by a full trench, the source plane including a step trench, and the gate plane including an electrical connection through the second substrate to a gate input connection of the power module, a semiconductor die disposed between the first substrate and the second substrate, the step trench formed in a portion of the source plane corresponding to an edge of the semiconductor die, and the semiconductor die including a gate connected to the gate plane, and a sinter element disposed between the semiconductor die and the second substrate to connect the semiconductor die to the second substrate; a battery configured to supply the DC power to the inverter; and a motor configured to receive the AC power from the inverter to drive the motor.

In some aspects, the techniques described herein relate to a system, wherein a thickness of the sinter element is in a range from approximately 25 μm to approximately 50 μm.

In some aspects, the techniques described herein relate to a system, wherein the power module is configured to exhibit a drain to source isolation voltage of at least 1200 volts.

In some aspects, the techniques described herein relate to a power module including: a first substrate having a first outer layer and a first inner layer; a semiconductor die coupled to a surface of the first inner layer; a second substrate having a second outer layer and a second inner layer, the semiconductor die coupled to a surface of the second inner layer; and a sinter element disposed between the semiconductor die and the second inner layer, wherein the second inner layer includes a body, the body including a source plane and a gate plane separated from the source plane by a full trench, and wherein the body includes a step trench in a portion of the body corresponding to an edge of the semiconductor die.

In some aspects, the techniques described herein relate to a power module, wherein a thickness of the sinter element is in a range from approximately 25 μm to approximately 50 μm.

In some aspects, the techniques described herein relate to a power module, wherein a thickness of the sinter element is approximately 25 μm.

In some aspects, the techniques described herein relate to a power module, wherein a depth of the step trench from a surface of the sinter element attached to the second inner layer to a bottom of the step trench is in a range from approximately 50 μm to approximately 75 μm.

In some aspects, the techniques described herein relate to a power module, wherein a depth from a surface of the semiconductor die attached to the sinter element to a bottom surface of the step trench as defined by the body of the second inner layer is in a range from approximately 75 μm to approximately 100 μm.

In some aspects, the techniques described herein relate to a power module, wherein the step trench is in the portion of the body corresponding to the edge of the semiconductor die so that a line extending from the edge of the semiconductor die to the body, in a direction orthogonal to the surface of the second inner layer, intersects the step trench.

In some aspects, the techniques described herein relate to a power module, wherein a width of the step trench is in a range from approximately 400 μm to approximately 500 μm.

In some aspects, the techniques described herein relate to a power module, wherein: the full trench extends through the body to an insulating layer of the second substrate, and the step trench has a depth that is less than a thickness of the body.

In some aspects, the techniques described herein relate to a power module, wherein the step trench is disposed in the source plane and the gate plane.

In some aspects, the techniques described herein relate to a power module, wherein the semiconductor die includes a source connection, wherein the source connection is coupled to the source plane of the second inner layer of the second substrate.

In some aspects, the techniques described herein relate to a power module, wherein the second substrate further includes a middle layer between the second inner layer and the second outer layer, wherein the middle layer includes a ceramic, wherein the second outer layer includes a metal, and wherein the second inner layer includes a direct bond copper metallization layer.

In some aspects, the techniques described herein relate to a power module, wherein the step trench is in the direct bond copper metallization layer.

In some aspects, the techniques described herein relate to an inverter including the power module.

In some aspects, the techniques described herein relate to a vehicle including the inverter.

In some aspects, the techniques described herein relate to a power module, including: a first substrate; a second substrate including a first trench extending through a conducting body of the second substrate to an insulating body of the second substrate, and the second substrate including a second trench extending from a surface of the second substrate into the conducting body of the second substrate at a depth less than a thickness of the conducting body; a semiconductor die disposed between the first substrate and the second substrate, the semiconductor die having a drain connection coupled to the first substrate and a source connection coupled to the second substrate; and a sinter element disposed between the semiconductor die and the second substrate, the sinter element having a thickness in a range of 25 μm to 50 μm; wherein the surface of the second substrate is attached to the sinter element.

In some aspects, the techniques described herein relate to a power module, wherein the second trench is etched into the conducting body of the second substrate in a portion of the second substrate corresponding to an edge of the semiconductor die.

In some aspects, the techniques described herein relate to a power module, wherein a width of the second trench is in a range of 400 μm to 500 μm.

In some aspects, the techniques described herein relate to a system including: an inverter configured to convert DC power to AC power, wherein the inverter includes: a power module including: a flex layer including a gate trace, a first substrate, a second substrate including a source plane and a gate plane separated from the source plane by a full trench, the source plane including a step trench, and the gate plane including an electrical connection through the gate trace of the flex layer to a gate input connection of the power module, a semiconductor die disposed between the first substrate and the second substrate, the step trench formed in a portion of the source plane corresponding to at an edge of the semiconductor die, and the semiconductor die including a gate connected to the gate plane, and a sinter element disposed between the semiconductor die and the second substrate to connect the semiconductor die to the second substrate; a battery configured to supply the DC power to the inverter; and a motor configured to receive the AC power from the inverter to drive the motor.

In some aspects, the techniques described herein relate to a system, wherein a thickness of the sinter element is in a range from approximately 25 μm to approximately 50 μm.

In some aspects, the techniques described herein relate to a system, wherein the power module is configured to exhibit a drain to source isolation voltage of at least 1200 volts.

In some aspects, the techniques described herein relate to a power module including: a signal layer including a gate trace; a first substrate having a first outer layer and a first inner layer; a semiconductor die coupled to a surface of the first inner layer; a second substrate having a second outer layer and a second inner layer, the semiconductor die coupled to a surface of the second inner layer; and a sinter element disposed between the semiconductor die and the second inner layer, wherein the second inner layer includes a body, the body including a source plane and a gate plane separated from the source plane by a full trench, the gate plane connected to the gate trace, and wherein the body includes a step trench in a portion of the body corresponding to an edge of the semiconductor die.

In some aspects, the techniques described herein relate to a power module, wherein a thickness of the sinter element is in a range from approximately 25 μm to approximately 50 μm.

In some aspects, the techniques described herein relate to a power module, wherein a thickness of the sinter element is approximately 25 μm.

In some aspects, the techniques described herein relate to a power module, wherein a depth of the step trench from a surface of the sinter element attached to the second inner layer to a bottom of the step trench is in a range from approximately 50 μm to approximately 75 μm.

In some aspects, the techniques described herein relate to a power module, wherein a depth from a surface of the semiconductor die attached to the sinter element to a bottom surface of the step trench as defined by the body of the second inner layer is in a range from approximately 75 μm to approximately 100 μm.

In some aspects, the techniques described herein relate to a power module, wherein the step trench is in the portion of the body corresponding to the edge of the semiconductor die so that a line extending from the edge of the semiconductor die to the body, in a direction orthogonal to the surface of the second inner layer, intersects the step trench.

In some aspects, the techniques described herein relate to a power module, wherein a width of the step trench is in a range from approximately 400 μm to approximately 500 μm.

In some aspects, the techniques described herein relate to a power module, wherein the signal layer is coupled to the gate plane.

In some aspects, the techniques described herein relate to a power module, wherein the signal layer includes a flex layer including an insulating material and an electrically conductive material, and wherein the electrically conductive material of the flex layer is the gate trace and is coupled to a gate of the semiconductor die.

In some aspects, the techniques described herein relate to a power module, wherein the semiconductor die includes a source connection, wherein the source connection is coupled to the source plane of the second inner layer of the second substrate.

In some aspects, the techniques described herein relate to a power module, wherein the second substrate further includes a middle layer between the second inner layer and the second outer layer, wherein the middle layer includes a ceramic, wherein the second outer layer includes a metal, and wherein the second inner layer includes a direct bond copper metallization layer.

In some aspects, the techniques described herein relate to a power module, wherein the step trench is in the direct bond copper metallization layer.

In some aspects, the techniques described herein relate to an inverter including the power module.

In some aspects, the techniques described herein relate to a vehicle including the inverter.

In some aspects, the techniques described herein relate to a power module, including: a signal layer including a gate trace; a first substrate; a second substrate including a first trench extending through a conducting body of the second substrate to an insulating body of the second substrate, and the second substrate including a second trench extending from a surface of the second substrate into the conducting body of the second substrate at a depth less than a thickness of the conducting body; a semiconductor die disposed between the first substrate and the second substrate, the semiconductor die having a drain connection coupled to the first substrate, a source connection coupled to the second substrate, and a gate coupled to the gate trace; and a sinter element disposed between the semiconductor die and the second substrate, the sinter element having a thickness in a range of 25 µm to 50 µm; wherein the surface of the second substrate is attached to the sinter element.

In some aspects, the techniques described herein relate to a power module, wherein the second trench is etched into the conducting body of the second substrate in a portion of the second substrate corresponding to an edge of the semiconductor die.

In some aspects, the techniques described herein relate to a power module, wherein a width of the second trench is in a range of 400 µm to 500 µm.

In some aspects, the techniques described herein relate to a system including: an inverter configured to convert DC power to AC power, wherein the inverter includes: a power module including: a flex layer including a gate trace providing an electrical connection to a gate input connection of the power module, a first substrate, a second substrate including a source plane, the source plane including a step trench, a semiconductor die disposed between the first substrate and the second substrate, the step trench formed in a portion of the source plane corresponding to at an edge of the semiconductor die, and the semiconductor die including a gate connected to the gate trace, and a sinter element disposed between the semiconductor die and the second substrate to connect the semiconductor die to the second substrate; a battery configured to supply the DC power to the inverter; and a motor configured to receive the AC power from the inverter to drive the motor.

In some aspects, the techniques described herein relate to a system, wherein a thickness of the sinter element is in a range from approximately 25 µm to approximately 50 µm.

In some aspects, the techniques described herein relate to a system, wherein the power module is configured to exhibit a drain to source isolation voltage of at least 1200 volts.

In some aspects, the techniques described herein relate to a power module including: a signal layer including a gate trace; a first substrate having a first outer layer and a first inner layer; a semiconductor die coupled to a surface of the first inner layer, the semiconductor die including a gate connected to the gate trace; a second substrate having a second outer layer and a second inner layer, the semiconductor die coupled to a surface of the second inner layer; and a sinter element disposed between the semiconductor die and the second inner layer, wherein the second inner layer includes a body, the body including a step trench formed in a portion of the body corresponding to an edge of the semiconductor die.

In some aspects, the techniques described herein relate to a power module, wherein a thickness of the sinter element is in a range from approximately 25 µm to approximately 50 µm.

In some aspects, the techniques described herein relate to a power module, wherein a thickness of the sinter element is approximately 25 µm.

In some aspects, the techniques described herein relate to a power module, wherein a depth of the step trench from a surface of the sinter element attached to the second inner layer to a bottom of the step trench is in a range from approximately 50 µm to approximately 75 µm.

In some aspects, the techniques described herein relate to a power module, wherein a depth from a surface of the semiconductor die attached to the sinter element to a bottom surface of the step trench as defined by the body of the second inner layer is in a range from approximately 75 µm to approximately 100 µm.

In some aspects, the techniques described herein relate to a power module, wherein the step trench is in the portion of the body corresponding to the edge of the semiconductor die so that a line extending from the edge of the semiconductor die to the body, in a direction orthogonal to the surface of the second inner layer, intersects the step trench.

In some aspects, the techniques described herein relate to a power module, wherein a width of the step trench is in a range from approximately 400 µm to approximately 500 µm.

In some aspects, the techniques described herein relate to a power module, wherein the signal layer is disposed on the body.

In some aspects, the techniques described herein relate to a power module, wherein the signal layer includes a flex layer including an insulating material and an electrically conductive material, and wherein the electrically conductive material of the flex layer is the gate trace and is coupled to a gate of the semiconductor die.

In some aspects, the techniques described herein relate to a power module, wherein the semiconductor die includes a source connection, wherein the source connection is coupled to the body of the second inner layer of the second substrate.

In some aspects, the techniques described herein relate to a power module, wherein the second substrate further includes a middle layer between the second inner layer and the second outer layer, wherein the middle layer includes a ceramic, wherein the second outer layer includes a metal, and wherein the second inner layer includes a direct bond copper metallization layer.

In some aspects, the techniques described herein relate to a power module, wherein the step trench is in the direct bond copper metallization layer.

In some aspects, the techniques described herein relate to an inverter including the power module.

In some aspects, the techniques described herein relate to a vehicle including the inverter.

In some aspects, the techniques described herein relate to a power module, including: a signal layer including a gate trace; a first substrate; a second substrate including a trench extending from a surface of the second substrate into a conducting body of the second substrate at a depth less than a thickness of the conducting body; a semiconductor die disposed between the first substrate and the second substrate, the semiconductor die having a drain connection coupled to the first substrate, a source connection coupled to the second substrate, and a gate coupled to the gate trace; and a sinter element disposed between the semiconductor die and the second substrate, the sinter element having a thickness in a range of 25 µm to 50 µm; wherein the surface of the second substrate is attached to the sinter element.

In some aspects, the techniques described herein relate to a power module, wherein the trench is etched into the conducting body of the second substrate in a portion of the second substrate corresponding to an edge of the semiconductor die.

In some aspects, the techniques described herein relate to a power module, wherein a width of the trench is in a range of 400 µm to 500 µm.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

7

8

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

FIG. 6 depicts an assembly of an exemplary power module including a substrate layer and a flex layer, according to one or more embodiments.

DETAILED DESCRIPTION OF EMBODIMENTS

Figure 1:
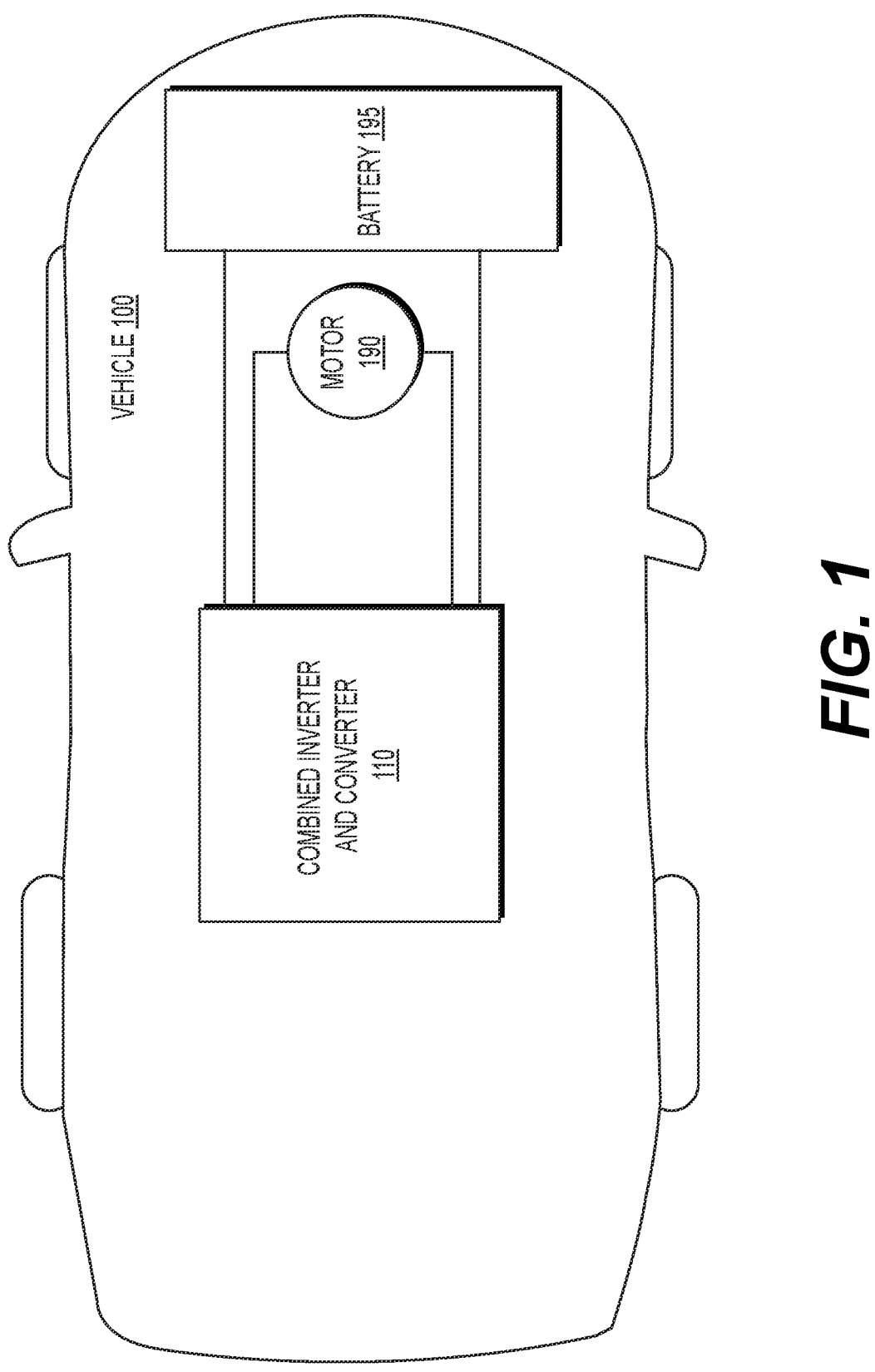
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to a power module for an inverter for an electric vehicle, and more specifically, to a power module including an etched trench that enables flexible sinter element sizing.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

Half-bridge topology selection for power modules may operate with lower loop inductance, less ringing, and voltage overshoot than other topologies. Using silicon carbide metal-oxide-semiconductor field-effect transistors (SiC MOSFETs) may result in reduced switching times relative to, for example, some silicon insulated gate bipolar transistors (Si IGBT), and the reduced inductance of a half bridge module may be pursued to take advantage of that capability.

Half bridge circuits may be used in power electronics to apply pulse width modulated voltage to control the current applied to inductive loads such as motors. In such a circuit, the source and its related circuits may most naturally be on the opposing substrates for the two switches in the half bridge. That is, in a half bridge circuit, the source connection of the upper switch and drain connection of the lower switch may share a common connection with the load, and the source and drain may be on opposite sides of a bare die that is used in power applications. For high voltage, dual side cooled applications, the source and the drain may be cooled through an insulating substrate, with the drain being on one substrate and the source being on another substrate.

Each power device in the half-bridge may have circuits referenced to the source connection. However, having the sources on opposing substrates in a dual side cooled package may cause difficulties for assembly. For example, bottom-up assembly for dual side cooled modules may be compromised, as each substrate and its source referenced circuit must be assembled separately and then brought together. In addition, a die associated with the lower substrate would be inverted from a die associated with the upper substrate, but the source and drain interconnects may have different voltage standoff requirements, causing height differences at the interconnect, which could cause issues with co-planarity during assembly. Such difficulties during assembly may lead to lower yields and higher costs. In addition, some devices may face issues of efficiency related to paths for heat and current.

Substrates incorporated in a power module, such as substrates forming a source (e.g., lower substrates, source side-substrates), may be physically and electrically connected to a semiconductor (e.g., silicon carbide (SiC)) die using solder preforms/informs or sintering elements (e.g. sinter pads, sinter film, sinter preforms). In some examples, solder preforms/informs function within power modules to mitigate high voltage potential between an edge of a semiconductor die and a source-connected substrate. These solder preforms/informs may have a finished thickness of greater than 75 μm.

Providing a sintering element with a final thickness of 75 μm, which may be required to ensure a required high voltage isolation within a power module, instead of solder preforms, may increase costs. Thermal performance of a power module may be negatively impacted by a thicker thermal bondline potentially resulting from incorporating a sinter element(s) of the thickness previously mentioned. Providing a sinter element(s) with a final thickness of less than 75 μm may inhibit an ability to meet a voltage isolation requirement, such as a 1200 volt isolation requirement, for example. A final sinter element thickness of less than 75 μm may have a potential to restrict a flow of overmold material, for example, into a gap between a die and a substrate during a power module assembly process.

Alternatives to using solder preforms may include using tall (1.5 to 2.0 mm) spacers on a source side of a semiconductor die. Even though the use of tall spacers may allow gates to be wire bonded, such a configuration requires a multiple (e.g., 2X or 3X) of sinter elements (e.g., sinter films), than those configurations without tall spacers. Furthermore, thermal performance within a power module incorporating the tall spacer configuration may be significantly degraded.

One or more embodiments may provide a sinter element thickness of less than 75 μm, by the addition of a structural feature to a metallization layer of a substrate. More specifically, a potential high voltage between a die surface of one or more SiC dies and a metallization layer of a lower substrate connected to a source may be mitigated by a trench formed (e.g., step etched) through a metallization surface and into a body of the metallization layer. A location of the trench in the metallization layer may correspond to an edge(s) of a semiconductor die. The trench may be in a portion of the metallization layer corresponding to the edge of the semiconductor die so that a line extending from the edge of the semiconductor die to the metallization layer, in a direction orthogonal to a surface of an inner layer of the metallization layer, intersects the trench.

A trench may have a first depth, measured from a metallization surface, into a body of the metallization layer, and to bottom surface of the trench, that may be in a range from approximately 75 μm to approximately 100 μm. A trench may have a second depth, measured from a surface of a semiconductor die facing a metallization layer including the trench, to a bottom surface of the trench, which may be in a range from approximately 100 μm to approximately 125 μm. A trench may have a width, from one side wall to an opposite facing side wall, which may be in a range from approximately 400 μm to approximately 500 μm.

Inclusion of a structural feature, such as a trench described herein, may reduce a cost to construct a power module as a sinter assembly. More specifically, because a trench provides a required isolation voltage, a need to construct a power module with a sinter element(s) having a final thickness of 75 μm or greater to serve that purpose may be obviated. In some examples, a sinter element(s) of a final thickness from approximately 25 μm to approximately 50 μm may be incorporated in a power module including a trench routed around, or more generally relative to, an edge(s) of semiconductor dies.

Furthermore, providing a sinter element with a thickness less than 75 μm may provide a thermal bondline that is thinner than that of a sinter element with a thickness of 75 μm or greater. As a result of the thinner bondline, a thermal performance of a power switch of a power module may be improved relative to a construction including a sinter element with a thickness of 75 μm or greater.

Inclusion of a structural feature, such as a trench, may allow for a reduction of sinter element thickness while also allowing for a proper flow of overmolding material into a gap between dies and a source substrate metallization layer. In addition, low aspect ratio sintering material may be used in construction of exemplary power modules of the present disclosure without compromising an ability to have gate and source connections to copper on a same plane, which enables and is necessary for avoidance of cracked semiconductor dies.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
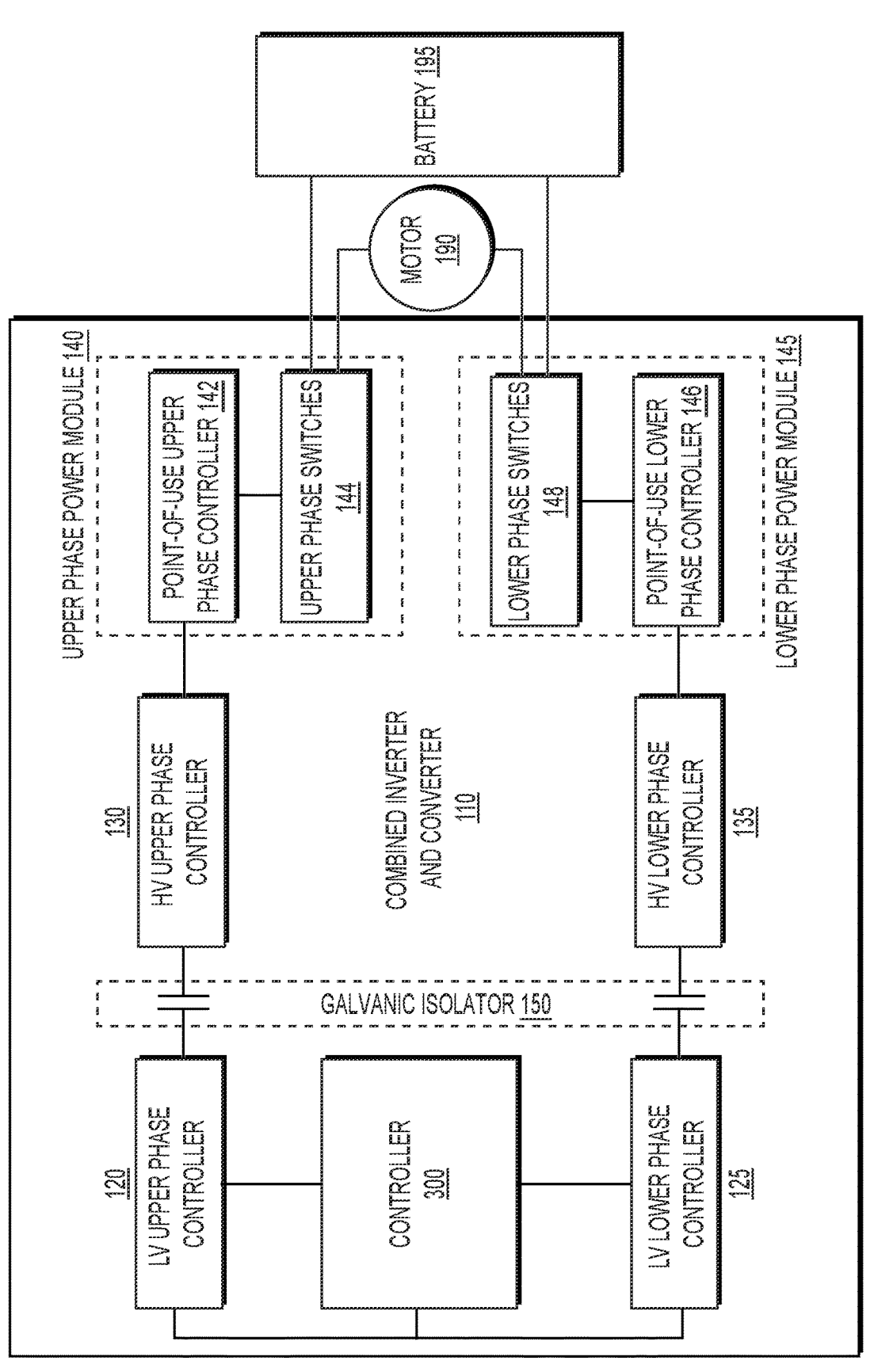
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries a complementary data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
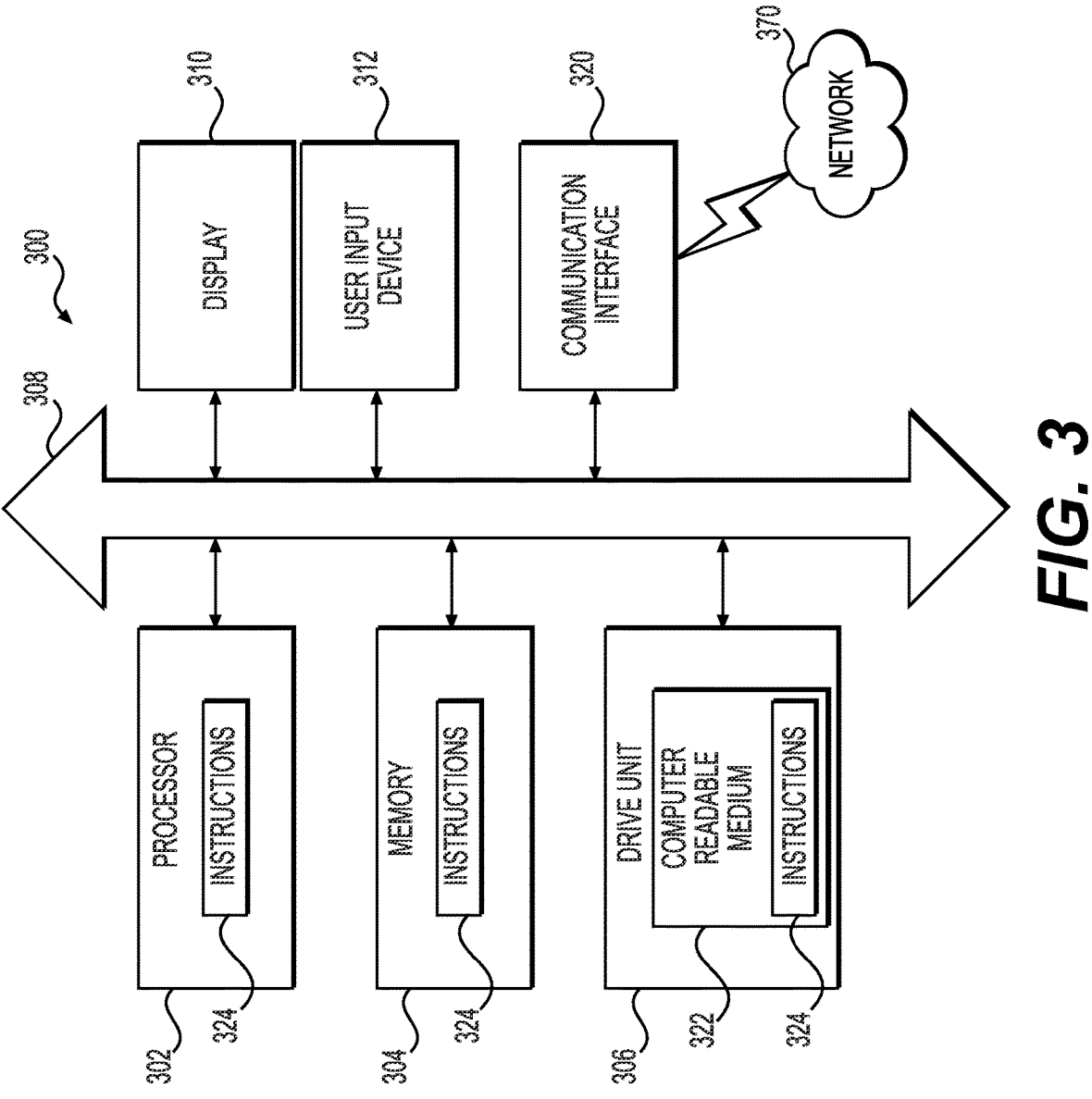
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific intercon-nected hardware modules or devices with related control and data signals that can be communicated between and through the modules, or as portions of an application-specific inte-grated circuit. Accordingly, the present system encompasses software, firmware, and hardware implementations.

The inverter controller 300 may be connected to a net-work 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be config-ured to couple one computing device to another computing device to enable communication of data between the devices. The network 370 may generally be enabled to employ any form of machine-readable media for communi-cating information from one device to another. The network 370 may include communication methods by which infor-mation may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the pres-ent disclosure, the methods described herein may be imple-mented by software programs executable by a computer system. Further, in an exemplary, non-limited implementa-tion, implementations can include distributed processing, component or object distributed processing, and parallel processing. Alternatively, virtual computer system process-ing can be constructed to implement one or more of the methods or functionality as described herein.

Although the present specification describes components and functions that may be implemented in particular imple-mentations with reference to particular standards and pro-tocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appro-priate processor (or processors) of a processing (i.e., com-puter) system executing instructions (computer-readable code) stored in storage. It will also be understood that the disclosure is not limited to any particular implementation or programming technique and that the disclosure may be implemented using any appropriate techniques for imple-menting the functionality described herein. The disclosure is not limited to any particular programming language or operating system.

Figure 4A:
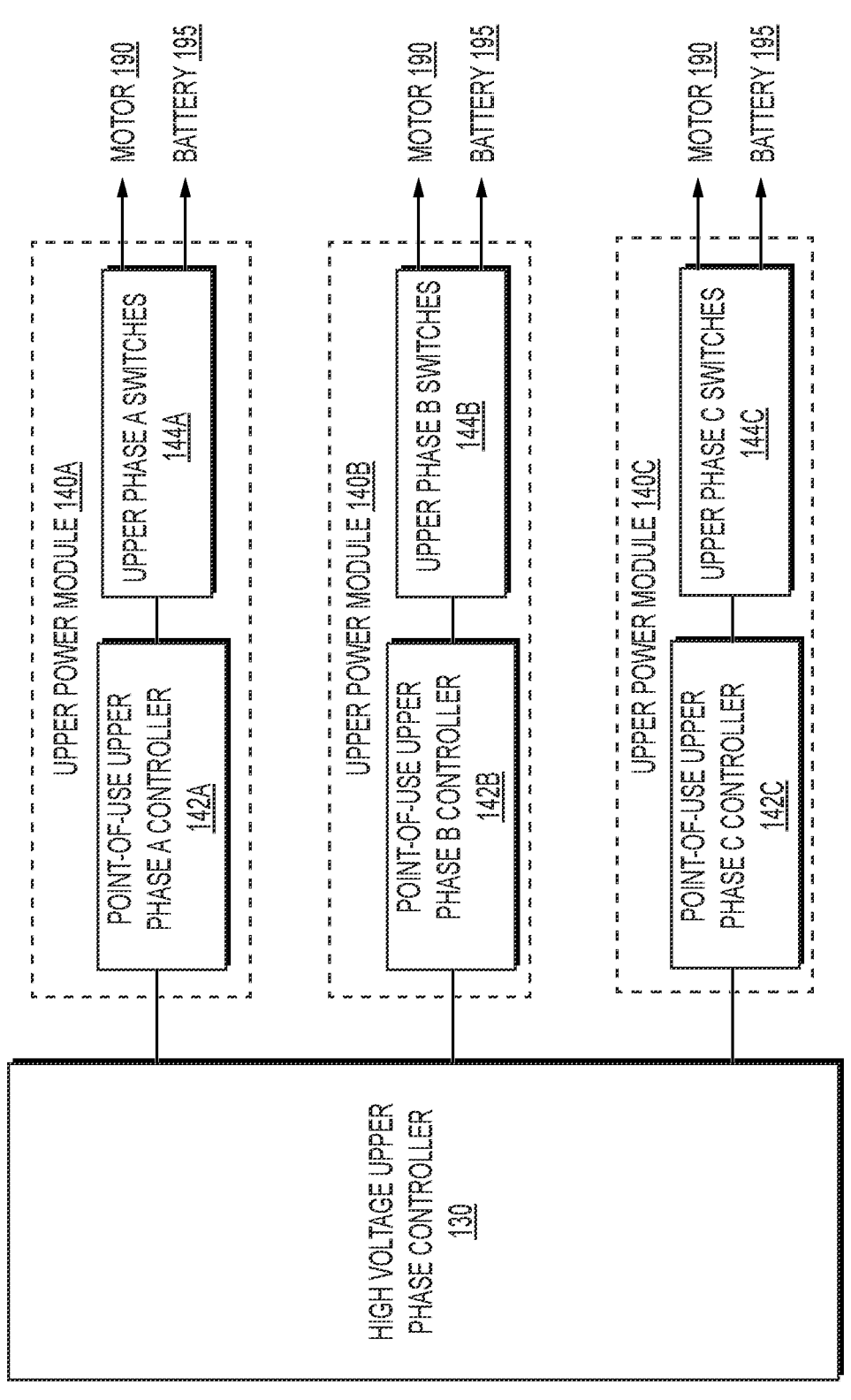
FIG. 4A depicts an exemplary system infrastructure for the point-of-use switch controller of FIG. 2, according to one or more embodiments.

FIG. 4A depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4A depicts details of the upper phase power module 140. Although not shown, the lower phase power module 145 may include a similar structure as the upper phase power module 140 for lower phases A, B, and C.

Figure 4B:
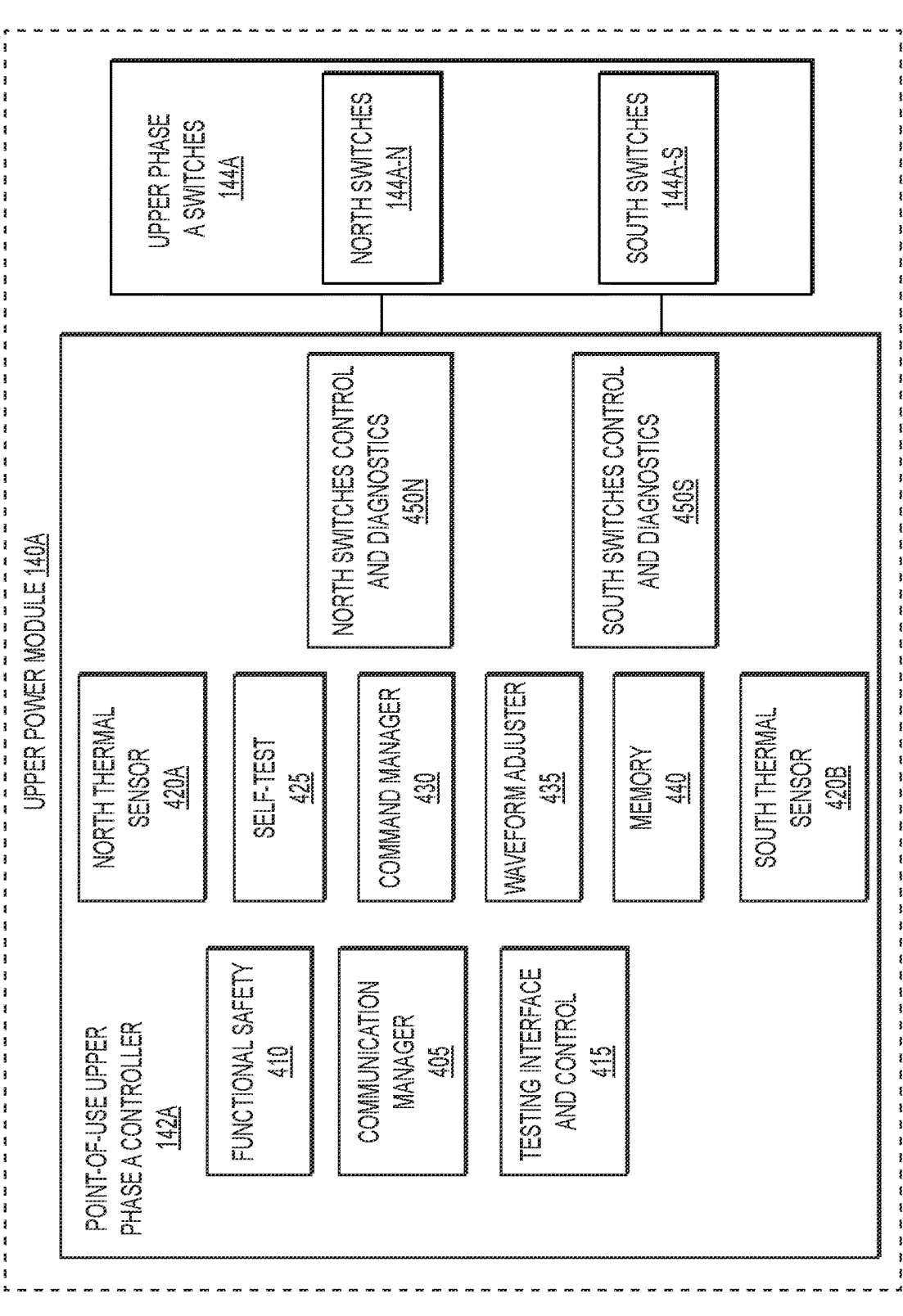
FIG. 4B depicts an exemplary system infrastructure for the upper power module of FIG. 4A, according to one or more embodiments.

FIG. 4B depicts an exemplary system infrastructure for the upper power module of FIG. 4A, according to one or more embodiments. For example, FIG. 4B provides addi-tional details of upper phase power module 140A. Although not shown, upper phase power module 140B, upper phase power module 140C, and respective lower phase power modules of lower phase power module 145 may include a similar structure as the upper phase power module 140A shown in FIG. 4B. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 4B, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 4B. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

General aspects of exemplary power modules according to the present disclosure will now be described. Exemplary power modules according to one or more embodiments of the present disclosure may provide a high current interconnect between a base substrate and a cap substrate. However, while some embodiments herein are referred to as "dual-side cooled", it is contemplated that the devices disclosed herein may be used in "single-side cooled" applications or combined active/passive cooling configurations. Exemplary power modules according to one or more embodiments may include: upper and lower substrates, both having middle layers of ceramic, e.g., silicon nitride ($Si_3N_4$) having outer layers of thick metallization, e.g., direct bond copper (DBC) or active metal brazing (AMB); a semiconductor (e.g., silicon carbide (SiC)) die that has a drain connection to the upper substrate; a source connection attached to the lower substrate; a polyimide or flex circuit including a base polyimide material with an internal copper layer, thereby providing a second metal layer between the semiconductor die and, for example, the lower substrate; a lead frame connection for a positive supply voltage (from a battery, for example); a lead frame connection for a negative supply voltage; and a dielectric material that is over-molded onto the power module assembly. Specific features (e.g., metallization layer including a trench, flex on a substrate) that may be incorporated in one or more embodiments according to the present disclosure, will now be described.

Figure 5:
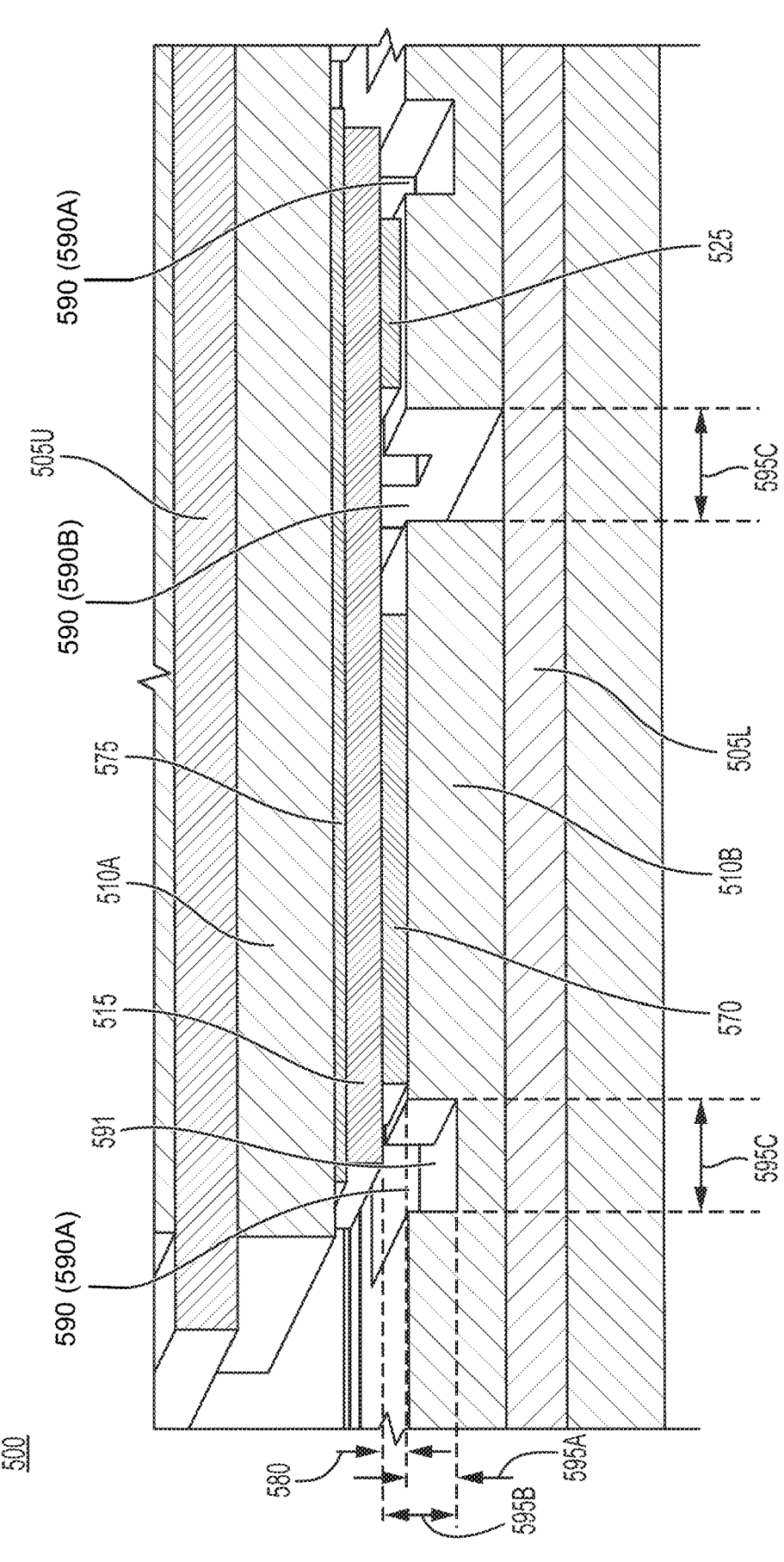
FIG. 5 depicts a cross-section of an exemplary architecture for a power module having a sintered configuration and including a trench, according to one or more embodiments.

FIG. 5 depicts a cross-section of an exemplary architecture for an exemplary power module 500 having a sintered configuration and including a trench 590, according to one or more embodiments. As shown in FIG. 5, the power module 500 according to one or more embodiments may include an upper substrate 505U and a lower substrate 505L. The upper substrate 505U may be a substrate of ceramic, e.g., silicon nitride ($Si_3N_4$) having thick metallization, e.g., direct bond copper (DBC) or active metal brazing (AMB) (hereafter referred to as "DBC 510A") at least on a side of the upper substrate 505U that faces an SiC die 515 and the lower substrate 505L. The DBC 510A may define an inner layer of the upper substrate 505U. The lower substrate 505L may be a substrate of ceramic, e.g., silicon nitride ($Si_3N_4$) having thick metallization, e.g. DBC, including the trench 590 (the metallization including the trench 590 hereafter referred to as "DBC 510B") disposed on a side of the lower substrate 505L that faces the upper substrate 505U. The DBC 510B may define an inner layer of the lower substrate 505L.

The power module 500 may further include multiple, such as eight, for example, SiC dies 515. A source connection to SiC dies 515 may be provided by first sinter element 570, as shown in FIG. 5, that may be attached to the lower substrate 505L. A gate connection to SiC dies 515 may be provided by gate sinter element 525 that may be attached to the lower substrate 505L. Gate sinter element 525 may be electrically separate from the source connection of first sinter element 570, but may be considered as a part of first sinter element 570. A drain connection to SiC dies 515 may be provided by second sinter element 575 that may be attached to the upper substrate 505U. In addition to those components depicted in FIG. 5, in some examples, the power module 500 may additionally include, for example, a surface mount component such as, for example, a temperature sensor, thermistor, capacitor, resistor, or another integrated circuit (IC) such as a gate driver, etc.

In contrast to other power modules that may employ a soldered assembly, the power module 500 depicted in FIG. 5 shows a sintered assembly including: (1) first sinter element 570 provided on a lower substrate side of the SiC die 515; and (2) second sinter element 575 provided on an upper substrate side of the SiC die 515. In one or more embodiments, the first sinter element 570 and second sinter element 575 may be provided by sinter preforms, sinter film, or sinter pads. For example, the first sinter element 570 may be constituted by a sinter preform, and the second sinter element 575 may be constituted by sinter film.

The trench 590 may be formed or otherwise provided in a surface of the DBC 510B that faces the SiC dies 515. In one example, the trench 590 may be etched in the DBC 510B. The trench 590 may include a step etched trench 590A and a full depth trench 590B. As discussed below, the trench 590 enables construction of the power module 500 with sinter preforms (or film) that are less than 75 μm in thickness, without compromising an ability of the power module 500 to exhibit a drain to source voltage isolation requirement. In one example, the power module 500 depicted in FIG. 5 may exhibit a drain to source isolation voltage of 1200 volts.

With the incorporation of the trench 590, the first sinter element 570 may have a thickness 580 of less than 75 μm as noted above. In one example, the thickness 580 may be within a range from approximately 25 μm to approximately 50 μm. For example, the thickness 580 may be approximately 25 μm.

As depicted in FIG. 5, step etched trench 590A may extend into DBC 510B, from a first surface of DBC 510B to a bottom surface 591 defined by DBC 510B, at a first depth 595A. The first depth 595A may be in a range from approximately 50 μm to approximately 75 μm. A distance from a die surface of the SiC dies 515 to the bottom surface 591 of the step etched trench 590A provided in the DBC 510B may be a second depth 595B. The second depth 595B may be in a range from approximately 75 μm to approximately 125 μm. A width 595C of the trench 590 may be in a range from approximately 400 μm to approximately 500 μm. As used herein, a width of a trench corresponds to a distance between side walls of a trench, a dimension of the trench that is measured along an axis that extends perpendicular to an axis along which a depth of the trench is measured and perpendicular to a longitudinal axis of the trench. Full depth trench 590B may extend through DBC 510B, from a first surface of DBC 510B to lower substrate 505L. A depth of full depth trench 590B may be approximately 500 μm, for example, and correspond to a thickness of DBC 510B. Full depth trench 590B may separate DBC 510B into a gate layer including gate sinter element 525, and a source layer including first sinter element 570 excluding gate sinter element 525.

As noted above, the first sinter element 570 and second sinter element 575 may be incorporated into the power module 500 instead of solder preforms/informs. In one example, as a substitute for solder preforms/informs on the lower substrate side of the SiC dies 515, the power module 500 may include sinter preforms for the first sinter element 570. In addition, the exemplary power module 500 depicted in FIG. 5 does not incorporate solder preforms/informs for mitigating a high voltage potential between an edge of a side of the SiC die 515 and the lower substrate 505L. Rather, a potential high voltage between the die surface of one or more of the SiC dies 515 and the DBC 510B of lower substrate 505L is mitigated by structural features of the DBC 510B, such as the trench 590, which may be etched through a surface and into a body of the DBC 510B.

In addition to the advantages previously discussed, inclusion of a structural feature, such as the trench 590, in a surface of a metallization layer (e.g. DBC 510B) disposed between a source side substrate, such as the lower substrate 505L, and a semiconductor die, such as the SiC dies 515, may reduce the cost to construct power modules as sinter assemblies. More specifically, because the trench 590 provides a required isolation voltage, a need to construct a power module, such as the power module 500, with sinter elements having a final thickness of 75 μm or greater to serve that purpose, may be obviated. Using (being able to use) sinter elements of a final thickness from approximately 25 μm to approximately 50 μm may be substantially less costly than providing sinter elements with a final thickness of approximately 75 μm.

Furthermore, providing sinter elements with a thickness less than 75 μm, and specifically within a range from approximately 25 μm to approximately 50 μm, in turn provides a thermal bondline that is thinner than sinter elements with a thickness of 75 μm or greater. As a result of the thinner bondline, a thermal performance of a power switch of a power module may be improved relative to a construction including sinter elements on a source side with a thickness of 75 μm or greater.

Inclusion of a structural feature, such as the trench 590 depicted in FIG. 5, may allow for a reduction of sinter thickness while also allowing for a proper flow of overmolding material into a gap between dies (e.g., SiC die 515) and a source substrate metallization layer (e.g. DBC 510B). Furthermore, low aspect ratio sintering material may be used in construction of exemplary power modules of the present disclosure, such as power module 500, without compromising an ability to have gate and source connections to copper on a same plane (e.g., connections between the DBC 510B and the gate sinter element 525) which enables and is necessary for avoidance of cracked dies (e.g., SiC dies 515).

FIG. 6 depicts an assembly of an exemplary power module 600 including a substrate 605 and a flex layer 660, according to one or more embodiments. For power module and switch applications desiring a high power density, a routing layer may be employed such that a gate connection does not interfere with either (a) a current capability of a source connection, or (b) thermal performance of a substrate by increasing a thermal impedance of the substrate.

FIG. 6 depicts a layered construction for a power module. As shown in FIG. 6, the power module 600 according to one or more embodiments may include the substrate 605 and the polyimide flex layer 660. The flex layer 660 may include a layer of metal 664 that provides a gate routing and this layer of metal 664 may constitute a second metal layer provided between a substrate and a die in exemplary power modules described herein. The first metal layer may be provided by a metallization of a ceramic, such as DBC 510B. Openings 661 may receive first sinter element 570, for example. The substrate 605 may be combined with the flex layer 660 to form a flex on substrate 668. The flex on substrate 668 may route a gate connection, and may reduce or eliminate cuts in a source plane that may otherwise be needed to route gate signals.

Although the use of a polyimide layer is depicted as an example implementation, alternate constructions using printed and fired conductive layers, such as, for example, silver (Ag) alloys, could also be used. A power module according to one or more embodiments may utilize sintering interconnection of various components, but other methods of component interconnection, such as soldering, may be used.

A power module according to one or more embodiments may represent a mixed medium approach to a multilayer board construction, which may be similar in some respects to a rigid flex construction, but with different materials and purpose. For example, a high current, thermally conductive substrate, such as copper bonded DBC or AMB on $Si_3N_4$, Aluminum Nitride (AlN), Alumina 96% ($Al_2O_3$) or other ceramic, may be used for thermal performance, and a flex circuit laminated on top of the substrate may be used for low level signal interconnect.

A power module according to one or more embodiments including a flex on a substrate (also referred to herein as "FoS"), may allow the full use of a source thermal path by using openings (e.g., openings 661) in a dielectric (e.g., flex layer 660) to directly make connection to the lower substrate copper. For example, as shown in FIG. 6, the thin layers of polyimide may route under a die to make gate connections.

Exemplary FoS constructions according to one or more embodiments, may eliminate a need to cut into the source plane with the gate runners, and, thus, may allow for planed copper to be directly connected to the source for low impedance electrical connection. That is, in some embodiments, the source plane or source material of a substrate and of a power module does not include any electrical connections to the gate. Such removal of the cuts in the source plane for the purposes of providing gate connections leaves more area to modify the source plane for other purposes, such as providing a trench. As discussed below, incorporation of a trench may allow a power module including sinter preforms of a reduced thickness to nonetheless exhibit a required drain to source voltage isolation.

In addition, exemplary FoS constructions according to one or more embodiments, may further insulate a gate connection that is routed under a die, across a die edge, where a high standoff may be required due to the presence of drain voltages, and around a perimeter of the die. The presence of a polyimide may increase the dielectric strength at that point, which may reduce an overall thickness of the assembly and the thermal resistance.

Exemplary FoS constructions according to one or more embodiments, may allow circuits, an SiC gate, and other dies to be referenced to a source plane for smaller loop areas. A return path for generated signals may be returned to the source of the signal along the source plane that exists below a routing path.

A power module according to one or more embodiments may represent a general methodology and resultant topology shift in maximizing the load current capability of a high current power module used in bridge applications such as a three phase traction inverter, without compromising the dual-side cooling and the overall material thickness within the cooling path.

The limitations of any semiconductor power switch are based upon allowed temperature rise of the die, the temperature capability of the die attach material, and the temperature of the cooling system. The losses associated with switching the required load current are applied to the conductive thermal impedance, and result in a temperature rise at the junction of the SiC FET/IGBT. This temperature rise is to be constrained and must remain within allowable temperature limitations. Limitations at the high end might be somewhat lower than the maximum die temperature. For example, a module may have transient excursions and temperature sensing accuracy limitations, making the actual junction temperature uncertain, so that power de-rating needs to occur at approximately 25 degrees less than that of the maximum. Limitations at the low end may be constrained by a 65 C max coolant temperature, but might have a fluid temperature increase within the cooling rails so that 75 C is the lower limit.

A direct way to widen the limits is to move the upper boundary, as it may not be constrained by a customer requirement, but rather a supplier requirement. For example, some suppliers allow the maximum junction of the die to be increased from 175 C to 185 C, but the die attach and the rest of the thermal stack should be considered.

Another method of increasing current density is to reduce switching losses. A SiC die is an enabler for reduced switching times. However, improved gate control is necessary to take advantage of the improvement. Improved gate control can reduce switching time, while controlling overshoots with dynamic control of the gate current during the turn-on and turn-off events. Issues with voltage drops across the source plane are inherent at high currents.

Improved gate control relies on being able to dynamically control the current during turn-on and turn-off and requires a low gate loop inductance. A second metal layer provided between a substrate and a die, including a polyimide flex material bonded over the source DBC/AMB copper may be employed by a power module according to one or more embodiments, thus enabling a reduced loop area for the gate current and its return current.

A power module according to one or more embodiments may utilize voided areas in the polyimide to enable direct connection of the source to the source plane of the DBC, while the gate layer is connected to the second metal of the polyimide flex circuit. In general, reduction of the power module thickness and the use of materials having higher thermal conductivity also allows current capabilities to be increased. On the other hand, use of clips and spacers in series with a source and drain connection may increase a thermal impedance.

A power module according to one or more embodiments may increase the upper temperature boundary condition by utilizing SiC MOSFETs with higher junction temperature to increase the upper temperature limit and increase the die size to 5.5 mm×5.5 mm, for example, and modify the thermal stack so the materials do not exceed the specified capability. A power module according to one or more embodiments may utilize an internal ASIC for temperature sensing without a custom SiC FET or thermistors. Such a configuration may support temperature sensing of upper and lower phases of a half-H switch without the use of a thermistor, which may have poor accuracy. One or more embodiments may use an ASIC to accurately sense temperature, but the use of thermistors or SiC/IGBT devices with temperature sensing are not precluded.

A power module according to one or more embodiments may reduce switching losses by employing an ASIC for dynamic gate control. The power module may further support multiple pins for gate control. A power module according to one or more embodiments may employ a second metal layer provided between a substrate and a die for gate routing in order to enable dynamic control of the gate voltage. Such a second metal layer may enable low gate loop inductance, and may enable the source plane to be an efficient signal return path. Polyimide offers very high dielectric breakdown of 200 kV/mm.

A power module according to one or more embodiments may obtain decreased thermal resistance through material thickness reduction and use of high thermal conductivity materials to allow high currents in the switching devices. Polyimide avoids attachment of drain or source connection to anything other than the DBC, and does not require spacers from the source to the surface of the substrate or the use of wire-bonds or clips.

Figure 7:
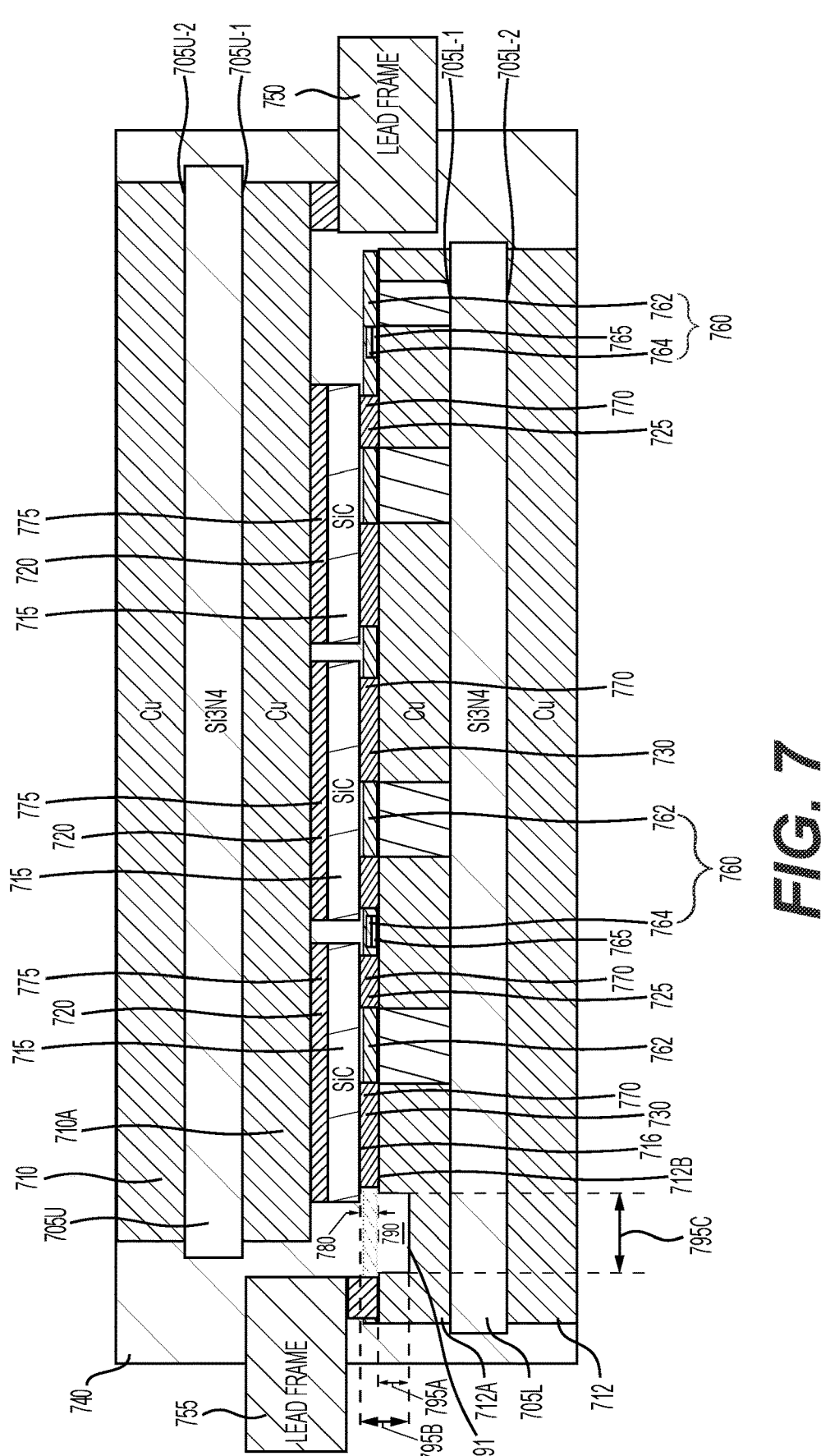
FIG. 7 depicts a cross-section view of an exemplary architecture for a power module having a sintered configuration and including a flex layer and a trench, according to one or more embodiments.

Exemplary FoS constructions according to one or more embodiments, may further allow for greater trace routing density over conventional DBC or AMB designs, which may require signal routing, and which may have lines and space that are limited due to copper thickness. FIG. 7 depicts a cross-section view of a power module 700 having a sintered configuration and including a flex layer provided by a polyimide or flex circuit 760, according to one or more embodiments. In addition, as discussed in more detail below, FIG. 7 depicts an exemplary architecture for the power module 700 that includes trench 790 formed in a metallization of a substrate, according to one or more embodiments.

As shown in FIG. 7, a power module 700 according to one or more embodiments may include an upper substrate 705U and a lower substrate 705L. The upper substrate 705U may be a substrate of ceramic, e.g., silicon nitride (Si₃N₄) having thick metallization, e.g., direct bond copper (DBC) or active metal brazing (AMB) (hereafter referred to as "DBC 710") on a first side 705U-1 and a second side 705U-2. The first side 705U-1 and respective DBC 710A, face the lower substrate 705L and define an inner layer of the upper substrate 705U. The second side 705U-2 and respective DBC 710, face away from the lower substrate 705L and define an outer layer of the upper substrate 705U.

The lower substrate 705L may be a substrate of ceramic, e.g., silicon nitride (Si₃N₄) having: (1) thick metallization, e.g. DBC, including the trench 790 (the metallization including the trench 790 hereafter referred to as "DBC 712A") disposed on a first side 705L-1 of the lower substrate 705L that faces the upper substrate 705U; and (2) thick DBC 712 disposed on a second side 705L-2 that faces away from the upper substrate 705U. The DBC 712A defines an inner layer of the lower substrate 705L, and the DBC 712 on the second side 705L-2 defines an outer layer of the lower substrate 705L.

The power module 700 may further include multiple, such as eight, for example, SiC dies 715 that may each have a drain connection 720 to the upper substrate 705U. A source connection 730 may, as shown in FIG. 7, may be attached to the lower substrate 705L. The flex layer provided by the polyimide or flex circuit 760, may include a base polyimide layer 762 with an internal copper layer 764, may provide an interconnect to gate connections 725 of SiC MOSFETs including SiC dies 715. In addition to those components depicted in FIG. 7, in some examples, the power module 700 may additionally include, for example, a surface mount component such as, for example, a temperature sensor, thermistor, capacitor, resistor, or another integrated circuit (IC) such as a gate driver, etc.

As depicted in FIG. 7, the power module 700 may further include a lead frame connection 750 for the drain (on upper substrate 705U) and a lead frame connection 755 for the source (on lower substrate 705L). The assembly may be over-molded with a dielectric material 740. The polyimide layer 762 may provide via connections 765 from the internal copper layer 764 to a source plane. As used herein, a via connection may include an electrical connection between metal layers in a circuit. The lead frame connection 750 and lead frame connection 755 may be sintered, soldered, or ultrasonically welded to power module 700.

In contrast to other power modules that may employ a soldered assembly, the power module 700 depicted in FIG. 7 shows a sintered assembly including: (1) via connections 765 to the DBC 712; (2) a first sinter element 770 provided on a lower substrate side of the SiC die 715; and (3) a second sinter element 775 provided on an upper substrate side of the a SiC die 715. In one or more embodiments, the first sinter element 770 and second sinter element 775 may be provided by sinter preforms, sinter film, or sinter pads. In one example, the first sinter element 770 may be constituted by sinter preforms, and the second sinter element 775 may be constituted by sinter film.

The trench 790 may be formed or otherwise provided in a surface 712B of the DBC 712A that faces the SiC dies 715. In one example, the trench 790 may be etched in the DBC 712A. As discussed below, the trench 790 enables construction of the power module 700 with sinter preforms (or film) that are less than 75 μm in thickness, without compromising an ability of the power module 700 to exhibit a drain to source voltage isolation requirement. In one example, the power module 700 depicted in FIG. 7 may exhibit a drain to source isolation voltage of 1200 volts.

With the incorporation of the trench 790, the first sinter element 770 may have a thickness 780 of less than 75 μm as noted above. In one example, the thickness 780 may be within a range from approximately 25 μm to approximately 50 μm. For example, the thickness 780 may be approximately 25 μm.

As depicted in FIG. 7, trench 790 extends into a body of the DBC 712A, from the first DBC surface 712B to a bottom surface 791 defined by DBC 712A, at a first depth 795A. The first depth 795A may be in a range from approximately 50 μm to approximately 75 μm. A distance from a first die surface 716 of the SiC dies 715 to the bottom surface 791 of the trench 790 provided in the body of the DBC 712A may be a second depth 795B. The second depth 795B may be in a range from approximately 75 μm to approximately 125 μm. A width 795C of the trench 790 may be in a range from approximately 400 μm to approximately 500 μm. As used herein, a width of a trench corresponds to a distance between side walls of a trench, a dimension of the trench that is measured along a first axis that extends perpendicular to an axis along which a depth of the trench is measured.

As noted above, the first sinter element 770 and second sinter element 775 may be incorporated into the power module 700 instead of solder preforms/informs. In one example, as a substitute for solder preforms/informs on the lower substrate side of the SiC dies 715, the power module 700 may include sinter preforms for the first sinter element 770. In addition, the exemplary power module 700 depicted in FIG. 7 does not incorporate solder preforms/informs for mitigating a high voltage potential between an edge of a side of the SiC die 715 corresponding to the first die surface 716 and the lower substrate 705L depicted in FIG. 7. Rather, a potential high voltage between the first die surface 716 of one or more of the SiC dies 715 and the DBC 712A of lower substrate 705L is mitigated by structural features of the DBC 712A, such as the trench 790, which may be etched through a surface 712B and into a body of the DBC 712A.

In addition to the advantages previously discussed, inclusion of a structural feature, such as the trench 790, in a surface (e.g. surface 712B) of a metallization layer (e.g. DBC 712A) disposed between a source side substrate, such as the lower substrate 705L, and a semiconductor die, such as the SiC dies 715, may reduce the cost to construct flex layer-including power modules as sinter assemblies. More specifically, because a trench, such as the trench 790, provides a required isolation voltage, a need to construct a power module, such as the power module 700 which includes the flex layer provided by the polyimide or flex circuit 760, with sinter elements having a final thickness of 75 μm or greater to serve that purpose, may be obviated. Using (being able to use) sinter elements of a final thickness from approximately 25 μm to approximately 50 μm may be substantially less costly than providing sinter elements with a final thickness of approximately 75 μm.

Furthermore, providing sinter elements with a thickness less than 75 μm, and specifically within a range from approximately 25 μm to approximately 50 μm, in turn may provide a thermal bondline that is thinner than that of sinter elements with a thickness of 75 μm or greater. As a result of the thinner bondline, a thermal performance of a power switch of a power module may be improved relative to a construction including sinter elements on a source side with a thickness of 75 μm or greater.

Inclusion of a structural feature, such as the trench 790 depicted in FIG. 7, may allow for a reduction of sinter thickness while also allowing for a proper flow of overmolding material into a gap between dies (e.g., SiC die 715) and a source substrate metallization layer (e.g. DBC 712A). Furthermore, low aspect ratio sintering material may be used in construction of exemplary power modules of the present disclosure, such as power module 700, without compromising an ability to have gate and source connections to copper on a same plane (e.g., connections between the DBC 712A and (1) the gate connections 725 and (2) the lead frame connection 755) which enables and is necessary for avoidance of cracked dies (e.g., SiC dies 715).

Figure 8:
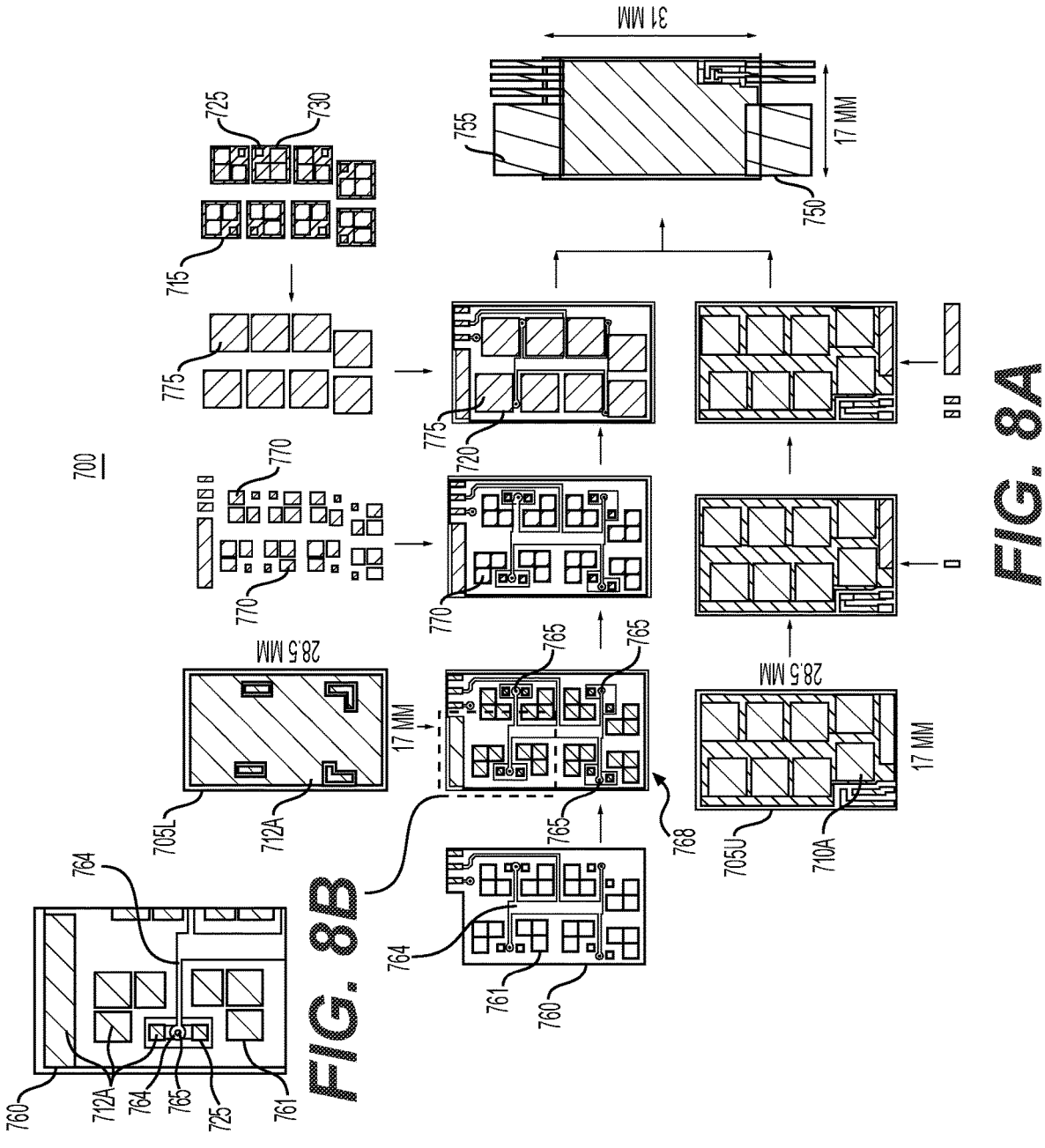
FIGS. 8A and 8B depict an assembly for the exemplary power module of FIG. 7, according to one or more embodiments.

FIGS. 8A and 8B depict an assembly of the exemplary power module 700 of FIG. 7 including the DBC 712A and having a sintered configuration, according to one or more embodiments. FIG. 8A and FIG. 8B depict various layers of a power module 700 using a sintered assembly according to one or more embodiments, and an assembly of the layers into a complete device. As shown in FIG. 8A, upper substrate 705U and lower substrate 705L may be individually assembled, and then integrated to form the power module 700. In one example, an intermediate stage in assembling the power module 700 may include combining the lower substrate 705L with the flex layer provided by the polyimide or flex circuit 760, and thereby define an FoS 768 as depicted in FIG. 8A. The polyimide or flex circuit 760 may include openings 761 accommodate the source connections 730 between the SiC dies 715 and the lower substrate 705L.

Figure 9:
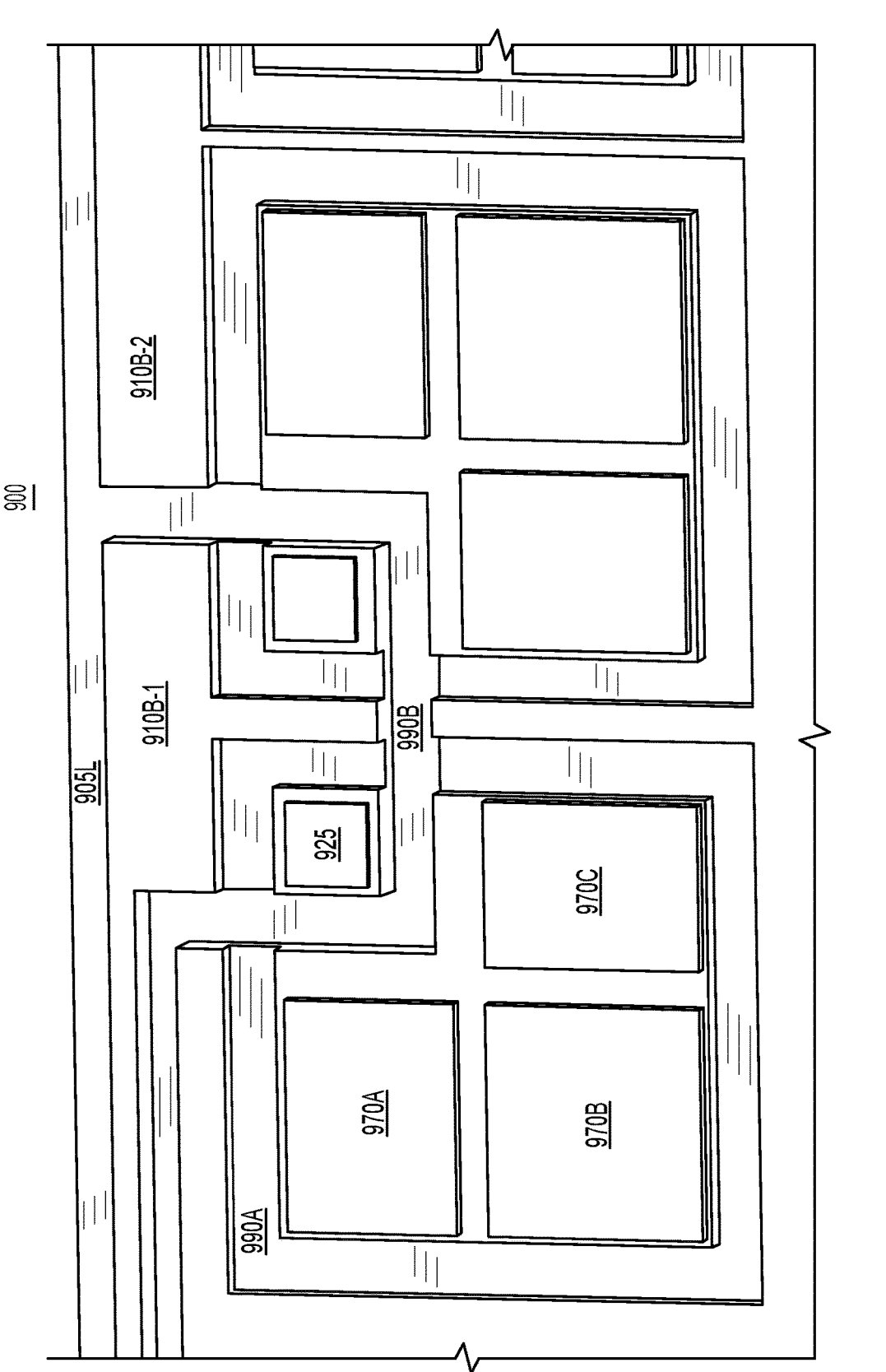
FIG. 9 depicts a layout of an exemplary power module including a full depth trench and a step etched trench, according to one or more embodiments.

FIG. 9 depicts a layout of an exemplary power module including a full depth trench and a step etched trench, according to one or more embodiments.

Power module 900 may be an implementation of upper phase power module 140 and/or lower phase power module 145, for example. Power module 900 may have similar elements as power module 500. Power module 900 may have elements arranged differently from power module 500. Power module 900 may include lower substrate 905L, DBC 910B, gate sinter element 925, first sinter element 970 (including elements 970A, 970B, and 970C), and trench 990. Trench 990 may include step trench 990A and full trench 990B. Similarly to step etched trench 590A, step trench 990A may be approximately 75 μm deep in DBC 910B. DBC 910B may be separated into gate plane 910B-1 and source plane 910B-2 by the full trench 990B. Step trench 990A may be provided in both gate plane 910B-1 and source plane 910B-2.

As shown in FIG. 9, electrical connections to a switch gate through gate sinter element 925 may be provided in the routing of DBC 910B, which may be an AMB/DBC copper layer. The gate sinter element 925 on gate plane 910B-1 may be separated completely from the source plane 910B-2 by the full trench 990B, and the required high voltage isolation may be generated with the step trench 990A along the edges of the first sinter element 970 to enable a reduced thickness of the sinter elements. The step trench 990A and full trench 990B may be filled with an overmold compound for electrical isolation of the components.

Figure 10:
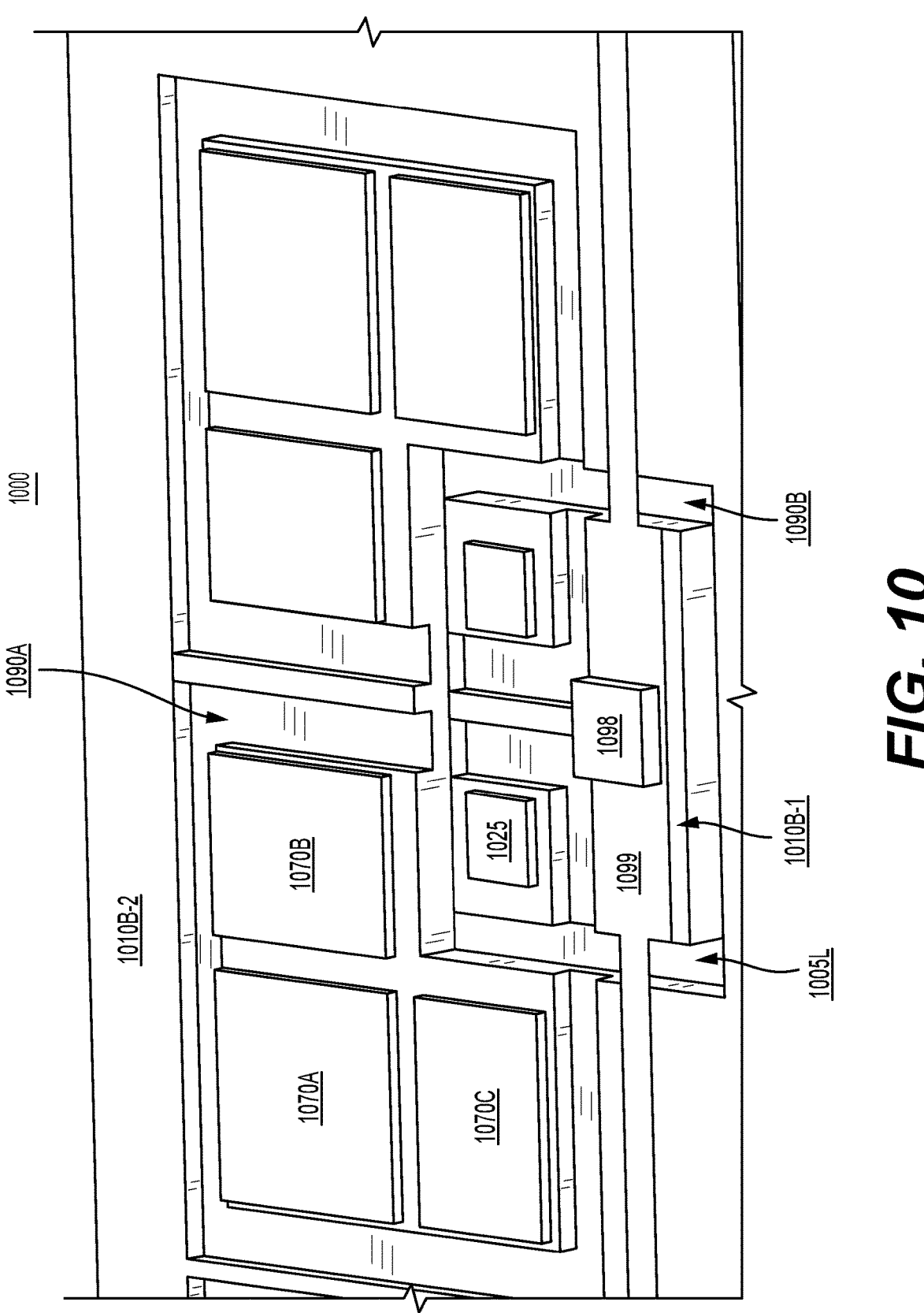
FIG. 10 depicts a layout of an exemplary power module including a full depth trench, a step etched trench, and a flex layer, according to one or more embodiments.

FIG. 10 depicts a layout of an exemplary power module including a full depth trench, a step etched trench, and a flex layer, according to one or more embodiments.

Power module 1000 may be an implementation of upper phase power module 140 and/or lower phase power module 145, for example. Power module 1000 may have similar elements as power module 500. Power module 1000 may have elements arranged differently from power module 500. Power module 1000 may include lower substrate 1005L, DBC 1010B, gate sinter element 1025, first sinter element 1070 (including elements 1070A, 1070B, and 1070C), and trench 1090. Trench 1090 may include step trench 1090A and full trench 1090B. Similarly to step etched trench 590A, step trench 1090A may be approximately 75 μm deep in DBC 1010B. DBC 1010B may be separated into gate plane 1010B-1 and source plane 1010B-2 by the full trench 1090B. Step trench 1090A may be provided in both gate plane 1010B-1 and source plane 1010B-2.

As shown in FIG. 10, full trench 1090B fully separates gate plane 1010B-1 from source plane 1010B-2. A flex layer (for example, as shown in FIG. 7) may include a gate trace 1099 to provide an electrical connection to a switch gate through gate sinter element 1025. Power module 1000 may include via 1098.

Figure 11:
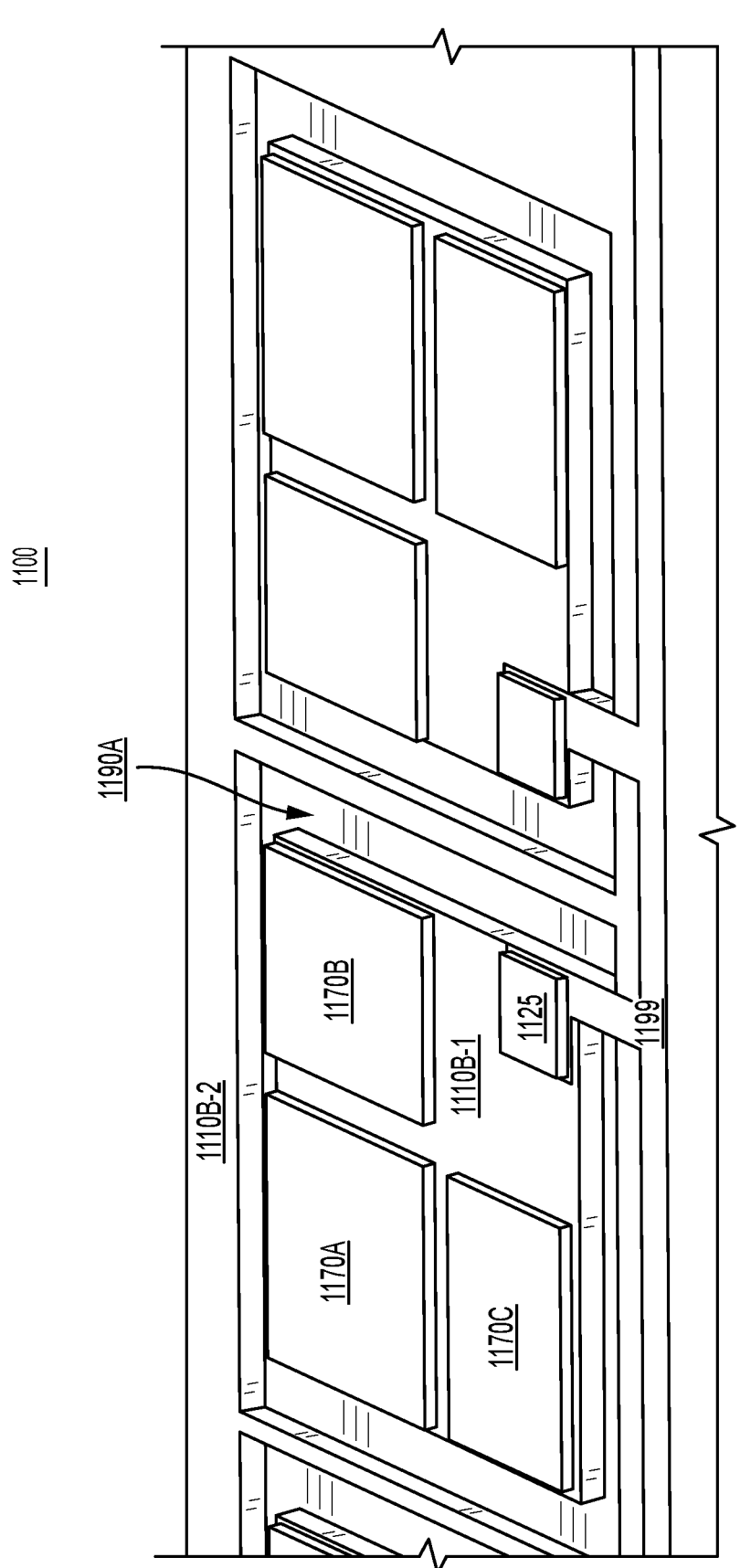
FIG. 11 depicts a layout of an exemplary power module including a step etched trench and a flex layer, according to one or more embodiments.

FIG. 11 depicts a layout of an exemplary power module including a step etched trench and a flex layer, according to one or more embodiments.

Power module 1100 may be an implementation of upper phase power module 140 and/or lower phase power module 145, for example. Power module 1100 may have similar elements as power module 500. Power module 1100 may have elements arranged differently from power module 500. Power module 1100 may include DBC 1110B, gate sinter element 1125, first sinter element 1170 (including elements 1170A, 1170B, and 1170C), and trench 1190. Trench 1190 may include step trench 1190A. Similarly to step etched trench 590A, step trench 1190A may be approximately 75 μm deep in DBC 1110B. DBC 1110B may include first source plane 1110B-1. DBC 1110B may include second source plane 1110B-2 mostly surrounded by step trench 1190A to provide HV isolation for components coupled to the first sinter element 1170.

As shown in FIG. 11, a flex layer (for example, as shown in FIG. 7) may include a gate trace 1199 to provide an electrical connection to a switch gate through gate sinter element 1125.

One or more embodiments may provide a sinter element thickness of less than 75 μm, by the addition of a structural feature to a metallization layer of a substrate. More specifically, a potential high voltage between a die surface of one or more SiC dies and a metallization layer of a lower substrate connected to a source may be mitigated by a trench formed (e.g., step etched) through a metallization surface and into a body of the metallization layer. A location of the trench in the metallization layer may correspond to an edge(s) of a semiconductor die.

A trench may have a first depth, measured from a metallization surface, into a body of the metallization layer, and to bottom surface of the trench, that may be in a range from approximately 75 μm to approximately 100 μm. A trench may have a second depth, measured from a surface of a semiconductor die facing a metallization layer including the trench, to a bottom surface of the trench, which may be in a range from approximately 100 μm to approximately 125 μm. A trench may have a width, from one side wall to an opposite facing side wall, which may be in a range from approximately 400 μm to approximately 500 μm.

Inclusion of a structural feature, such as a trench described herein, may reduce a cost to construct a power module as a sinter assembly. More specifically, because a trench provides a required isolation voltage, a need to construct a power module a with a sinter element(s) having a final thickness of 75 μm or greater to serve that purpose, may be obviated. In some examples, a sinter element(s) of a final thickness from approximately 25 μm to approximately 50 μm may be incorporated in a power module including a trench routed around, or more generally relative to, an edge(s) of semiconductor dies.

Furthermore, providing a sinter element with a thickness less than 75 μm may provide a thermal bondline that is thinner than that of a sinter element with a thickness of 75 μm or greater. As a result of the thinner bondline, a thermal performance of a power switch of a power module may be improved relative to a construction including a sinter element with a thickness of 75 μm or greater.

Inclusion of a structural feature, such as a trench, may allow for a reduction of sinter element thickness while also allowing for a proper flow of overmolding material into a gap between dies and a source substrate metallization layer. In addition, low aspect ratio sintering material may be used in construction of exemplary power modules of the present disclosure without compromising an ability to have gate and source connections to copper on a same plane, which enables and is necessary for avoidance of cracked semiconductor dies.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A power module comprising:
a signal layer including a gate trace;
a first substrate having a first outer layer and a first inner layer;
a semiconductor die coupled to a surface of the first inner layer, the semiconductor die including a gate connected to the gate trace;
a second substrate having a second outer layer and a second inner layer, the semiconductor die coupled to a surface of the second inner layer; and
a sinter element disposed between the semiconductor die and the second inner layer,
wherein the second inner layer includes a body, the body including a step trench formed in a portion of the body corresponding to an edge of the semiconductor die.

2. The power module of claim 1, wherein a thickness of the sinter element is in a range from approximately 25 μm to approximately 50 μm.

3. The power module of claim 1, wherein a thickness of the sinter element is approximately 25 μm.

4. The power module of claim 1, wherein a depth of the step trench from a surface of the sinter element attached to the second inner layer to a bottom of the step trench is in a range from approximately 50 μm to approximately 75 μm.

5. The power module of claim 1, wherein a depth from a surface of the semiconductor die attached to the sinter element to a bottom surface of the step trench as defined by the body of the second inner layer is in a range from approximately 75 μm to approximately 100 μm.

6. The power module of claim 1, wherein the step trench is in the portion of the body corresponding to the edge of the semiconductor die so that a line extending from the edge of the semiconductor die to the body, in a direction orthogonal to the surface of the second inner layer, intersects the step trench.

7. The power module of claim 1, wherein a width of the step trench is in a range from approximately 400 μm to approximately 500 μm.

8. The power module of claim 1, wherein the signal layer is disposed on the body.

9. The power module of claim 8, wherein the signal layer includes a flex layer including an insulating material and an electrically conductive material, and wherein the electrically conductive material of the flex layer is the gate trace and is coupled to a gate of the semiconductor die.

10. The power module of claim 1, wherein the semiconductor die includes a source connection, wherein the source connection is coupled to the body of the second inner layer of the second substrate.

11. The power module of claim 1, wherein the second substrate further includes a middle layer between the second inner layer and the second outer layer,
wherein the middle layer includes a ceramic,
wherein the second outer layer includes a metal, and
wherein the second inner layer includes a direct bond copper metallization layer.

12. The power module of claim 11, wherein the step trench is in the direct bond copper metallization layer.

13. An inverter comprising the power module of claim 1.

14. A vehicle comprising the inverter of claim 13.

15. A power module, comprising:
a signal layer including a gate trace;
a first substrate;
a second substrate including a trench extending from a surface of the second substrate into a conducting body of the second substrate at a depth less than a thickness of the conducting body;
a semiconductor die disposed between the first substrate and the second substrate, the semiconductor die having a drain connection coupled to the first substrate, a source connection coupled to the second substrate, and a gate coupled to the gate trace; and
a sinter element disposed between the semiconductor die and the second substrate, the sinter element having a thickness in a range of 25 μm to 50 μm;
wherein the surface of the second substrate is attached to the sinter element.

16. The power module of claim 15, wherein the trench is etched into the conducting body of the second substrate in a portion of the second substrate corresponding to an edge of the semiconductor die.

17. The power module of claim 15, wherein a width of the trench is in a range of 400 μm to 500 μm.

* * * * *